United States Patent
Cronie et al.

(10) Patent No.: US 9,362,947 B2
(45) Date of Patent: Jun. 7, 2016

(54) SORTING DECODER

(71) Applicant: KANDOU LABS S.A., Lausanne (CH)

(72) Inventors: Harm Cronie, Lausanne (CH); Brian Holden, Monte Sereno, CA (US)

(73) Assignee: KANDOU LABS, S.A. (CH)

( * ) Notice: Subject to any disclaimer, the term of this patent is extended or adjusted under 35 U.S.C. 154(b) by 0 days.

(21) Appl. No.: 14/823,866

(22) Filed: Aug. 11, 2015

(65) Prior Publication Data

US 2016/0036461 A1 Feb. 4, 2016

Related U.S. Application Data

(63) Continuation of application No. 13/844,331, filed on Mar. 15, 2013, now Pat. No. 9,106,238.

(60) Provisional application No. 61/697,540, filed on Sep. 6, 2012.

(51) Int. Cl.
*H03M 1/36* (2006.01)
*H03M 7/00* (2006.01)
(Continued)

(52) U.S. Cl.
CPC ............. *H03M 7/00* (2013.01); *G06F 11/1072* (2013.01); *H03M 1/18* (2013.01)

(58) Field of Classification Search
CPC ........... H03M 1/56; H03M 1/12; H03M 1/34; H03M 1/361; H03M 13/6561; H03M 1/00; H03M 1/365; H03M 1/0663; H03M 1/362; H03M 1/70

USPC .................................. 341/155, 158, 159, 160
See application file for complete search history.

(56) References Cited

U.S. PATENT DOCUMENTS

| 3,196,351 A | 7/1965 | Slepian |
| 3,636,463 A | 1/1972 | Ongkiehong |

(Continued)

FOREIGN PATENT DOCUMENTS

| CN | 101478286 | 7/2009 |
| EP | 2039221 B1 | 3/2009 |

(Continued)

OTHER PUBLICATIONS

International Search Report and Written Opinion of the International Searching Authority, mailed Nov. 5, 2012, in International Patent Application S.N. PCT/EP2012/052767, 7 pages.

(Continued)

*Primary Examiner* — Linh Nguyen
(74) *Attorney, Agent, or Firm* — Invention Mine LLC

(57) ABSTRACT

A sorting decoder captures the rank-order of a set of input analogue signals in the digital domain using simple logic components such as self-timed first state elements, without requiring conventional analogue-to-digital signal converters. The analogue signals are each compared against a monotonic dynamic reference and the resulting comparisons are snapshot by a self-timed first state element for each input signal, or the last member of a sorted collection of input signals, at the time when it reaches the reference signal, so that a different snapshot representing the signal value ranking relative to the other signal values is produced for each input signal. The resulting rank-order estimation snapshots are binary signals that can then be further processed by a simple sorting logic circuit based on elementary logic components.

20 Claims, 14 Drawing Sheets

(51) Int. Cl.
*H03M 1/18* (2006.01)
*G06F 11/10* (2006.01)

(56) References Cited

U.S. PATENT DOCUMENTS

| | | | |
|---|---|---|---|
| 3,939,468 A | 2/1976 | Mastin | |
| 4,163,258 A | 7/1979 | Ebihara et al. | |
| 4,181,967 A | 1/1980 | Nash et al. | |
| 4,206,316 A | 6/1980 | Burnsweig et al. | |
| 4,276,543 A * | 6/1981 | Miller | H01L 21/8222 257/E21.608 |
| 4,486,739 A | 12/1984 | Franaszek et al. | |
| 4,499,550 A | 2/1985 | Ray et al. | |
| 4,774,498 A * | 9/1988 | Traa | H03M 1/00 341/120 |
| 4,864,303 A | 9/1989 | Ofek | |
| 4,897,657 A * | 1/1990 | Brubaker | H03K 19/0948 341/159 |
| 5,053,974 A | 10/1991 | Penz | |
| 5,166,956 A | 11/1992 | Baltus et al. | |
| 5,168,509 A | 12/1992 | Nakamura et al. | |
| 5,283,761 A | 2/1994 | Gillingham | |
| 5,287,305 A | 2/1994 | Yoshida | |
| 5,412,689 A | 5/1995 | Chan et al. | |
| 5,459,465 A * | 10/1995 | Kagey | H03M 1/146 341/156 |
| 5,511,119 A | 4/1996 | Lechleider | |
| 5,553,097 A | 9/1996 | Dagher | |
| 5,599,550 A | 2/1997 | Kohlruss et al. | |
| 5,659,353 A | 8/1997 | Kostreski et al. | |
| 5,825,808 A | 10/1998 | Hershey et al. | |
| 5,875,202 A | 2/1999 | Venters | |
| 5,945,935 A * | 8/1999 | Kusumoto | H03M 1/206 341/159 |
| 5,995,016 A | 11/1999 | Perino | |
| 6,005,895 A | 12/1999 | Perino et al. | |
| 6,084,883 A | 7/2000 | Norrell et al. | |
| 6,172,634 B1 | 1/2001 | Leonowich et al. | |
| 6,175,230 B1 | 1/2001 | Hamblin et al. | |
| 6,232,908 B1 * | 5/2001 | Nakaigawa | H03M 1/365 341/155 |
| 6,278,740 B1 * | 8/2001 | Nordyke | H04L 5/20 327/63 |
| 6,346,907 B1 * | 2/2002 | Dacy | H03M 1/56 341/157 |
| 6,359,931 B1 | 3/2002 | Perino et al. | |
| 6,404,820 B1 | 6/2002 | Postol | |
| 6,417,737 B1 | 7/2002 | Moloudi et al. | |
| 6,452,420 B1 | 9/2002 | Wong | |
| 6,483,828 B1 | 11/2002 | Balachandran | |
| 6,504,875 B2 | 1/2003 | Perino et al. | |
| 6,509,773 B2 | 1/2003 | Buchwald | |
| 6,556,628 B1 | 4/2003 | Poulton et al. | |
| 6,563,382 B1 | 5/2003 | Yang et al. | |
| 6,621,427 B2 | 9/2003 | Greenstreet | |
| 6,650,638 B1 | 11/2003 | Walker et al. | |
| 6,661,355 B2 | 12/2003 | Cornelius et al. | |
| 6,766,342 B2 | 7/2004 | Kechriotis | |
| 6,839,429 B1 | 1/2005 | Gaikwald et al. | |
| 6,954,492 B1 | 10/2005 | Williams | |
| 6,990,138 B2 | 1/2006 | Bejjani | |
| 6,999,516 B1 | 2/2006 | Rajan | |
| 7,023,817 B2 | 4/2006 | Kuffner | |
| 7,053,802 B2 | 5/2006 | Cornelius | |
| 7,085,153 B2 | 8/2006 | Ferrant et al. | |
| 7,142,612 B2 | 11/2006 | Horowitz et al. | |
| 7,142,865 B2 | 11/2006 | Tsai | |
| 7,167,019 B2 | 1/2007 | Broyde et al. | |
| 7,180,949 B2 | 2/2007 | Kleveland et al. | |
| 7,184,483 B2 | 2/2007 | Rajan | |
| 7,356,213 B1 | 4/2008 | Cunningham et al. | |
| 7,358,869 B1 | 4/2008 | Chiarulli et al. | |
| 7,362,130 B2 | 4/2008 | Broyde et al. | |
| 7,389,333 B2 | 6/2008 | Moore et al. | |
| 7,633,850 B2 | 12/2009 | Ahn | |
| 7,656,321 B2 | 2/2010 | Wang | |
| 7,706,524 B2 | 4/2010 | Zerbe | |
| 7,746,764 B2 | 6/2010 | Rawlins et al. | |
| 7,787,572 B2 | 8/2010 | Scharf et al. | |
| 7,882,413 B2 | 2/2011 | Chen et al. | |
| 7,933,770 B2 | 4/2011 | Kruger et al. | |
| 8,064,535 B2 | 11/2011 | Wiley | |
| 8,091,006 B2 | 1/2012 | Prasad et al. | |
| 8,106,806 B2 * | 1/2012 | Toyomura | H03M 1/205 341/155 |
| 8,159,375 B2 | 4/2012 | Abbasfar | |
| 8,159,376 B2 | 4/2012 | Abbasfar | |
| 8,199,849 B2 | 6/2012 | Oh | |
| 8,279,094 B2 * | 10/2012 | Abbasfar | H04L 25/4908 341/50 |
| 8,295,250 B2 | 10/2012 | Gorokhov | |
| 8,310,389 B1 * | 11/2012 | Chui | H02M 3/157 323/283 |
| 8,429,495 B2 | 4/2013 | Przybylski | |
| 8,442,099 B1 | 5/2013 | Sederat | |
| 8,442,210 B2 | 5/2013 | Zerbe | |
| 8,443,223 B2 | 5/2013 | Abbasfar | |
| 8,462,891 B2 | 6/2013 | Kizer et al. | |
| 8,520,493 B2 | 8/2013 | Goulahsen | |
| 8,547,272 B2 | 10/2013 | Nestler et al. | |
| 8,578,246 B2 | 11/2013 | Mittelholzer | |
| 8,588,280 B2 | 11/2013 | Oh et al. | |
| 8,593,305 B1 | 11/2013 | Tajalli et al. | |
| 8,649,446 B2 | 2/2014 | Cronie | |
| 8,649,460 B2 | 2/2014 | Ware et al. | |
| 8,718,184 B1 | 5/2014 | Cronie | |
| 8,782,578 B2 | 7/2014 | Tell | |
| 8,989,317 B1 | 3/2015 | Holden | |
| 9,077,386 B1 | 7/2015 | Holden | |
| 2001/0055344 A1 | 12/2001 | Lee et al. | |
| 2002/0034191 A1 | 3/2002 | Shattil | |
| 2002/0057592 A1 | 5/2002 | Robb | |
| 2002/0163881 A1 | 11/2002 | Dhong | |
| 2002/0174373 A1 | 11/2002 | Chang | |
| 2003/0071745 A1 | 4/2003 | Greenstreet | |
| 2003/0105908 A1 | 6/2003 | Perino et al. | |
| 2003/0146783 A1 | 8/2003 | Bandy et al. | |
| 2003/0227841 A1 | 12/2003 | Tateishi et al. | |
| 2004/0003336 A1 | 1/2004 | Cypher | |
| 2004/0003337 A1 | 1/2004 | Cypher | |
| 2004/0057525 A1 | 3/2004 | Rajan et al. | |
| 2004/0086059 A1 | 5/2004 | Eroz et al. | |
| 2004/0156432 A1 | 8/2004 | Hidaka | |
| 2005/0057379 A1 * | 3/2005 | Jansson | H03M 1/1019 341/120 |
| 2005/0135182 A1 | 6/2005 | Perino et al. | |
| 2005/0152385 A1 | 7/2005 | Cioffi | |
| 2005/0174841 A1 | 8/2005 | Ho | |
| 2005/0286643 A1 | 12/2005 | Ozawa et al. | |
| 2006/0115027 A1 | 6/2006 | Srebranig | |
| 2006/0159005 A1 | 7/2006 | Rawlins et al. | |
| 2007/0188367 A1 * | 8/2007 | Yamada | H03M 1/123 341/155 |
| 2007/0260965 A1 | 11/2007 | Schmidt et al. | |
| 2007/0263711 A1 | 11/2007 | Kramer et al. | |
| 2007/0283210 A1 | 12/2007 | Prasad et al. | |
| 2008/0104374 A1 | 5/2008 | Mohamed | |
| 2008/0159448 A1 | 7/2008 | Anim-Appiah et al. | |
| 2008/0169846 A1 | 7/2008 | Lan et al. | |
| 2008/0273623 A1 | 11/2008 | Chung et al. | |
| 2008/0284524 A1 | 11/2008 | Kushiyama | |
| 2009/0059782 A1 | 3/2009 | Cole | |
| 2009/0092196 A1 | 4/2009 | Okunev | |
| 2009/0132758 A1 | 5/2009 | Jiang | |
| 2009/0154500 A1 | 6/2009 | Diab et al. | |
| 2009/0163612 A1 | 6/2009 | Lee et al. | |
| 2009/0185636 A1 | 7/2009 | Palotai et al. | |
| 2009/0212861 A1 | 8/2009 | Lim et al. | |
| 2009/0228767 A1 | 9/2009 | Oh et al. | |
| 2009/0257542 A1 | 10/2009 | Evans et al. | |
| 2010/0104047 A1 | 4/2010 | Chen et al. | |
| 2010/0180143 A1 | 7/2010 | Ware et al. | |
| 2010/0205506 A1 | 8/2010 | Hara | |
| 2010/0296550 A1 | 11/2010 | Abou Rjeily | |

(56) References Cited

U.S. PATENT DOCUMENTS

| | | | |
|---|---|---|---|
| 2011/0051854 | A1 | 3/2011 | Kizer et al. |
| 2011/0084737 | A1 | 4/2011 | Oh et al. |
| 2011/0127990 | A1 | 6/2011 | Wilson et al. |
| 2011/0235501 | A1 | 9/2011 | Goulahsen |
| 2011/0268225 | A1 | 11/2011 | Cronie et al. |
| 2011/0299555 | A1 | 12/2011 | Cronie et al. |
| 2011/0302478 | A1 | 12/2011 | Cronie et al. |
| 2011/0317559 | A1 | 12/2011 | Kern et al. |
| 2012/0063291 | A1 | 3/2012 | Hsueh |
| 2012/0161945 | A1 | 6/2012 | Single |
| 2012/0213299 | A1 | 8/2012 | Cronie et al. |
| 2013/0010892 | A1 | 1/2013 | Cronie et al. |
| 2013/0051162 | A1 | 2/2013 | Amirkhany et al. |
| 2014/0254730 | A1 | 9/2014 | Kim et al. |
| 2015/0010044 | A1 | 1/2015 | Zhang |
| 2015/0078479 | A1 | 3/2015 | Whitby-Strevens |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

International Search Report and Written Opinion of the International Searching Authority, mailed Jul. 14, 2011 in International Patent Application S.N. PCT/EP2011/002170, 10 pages.

Healey, A., et al., "A Comparison of 25 Gbps NRZ & PAM-4 Modulation used in Legacy & Premium Backplane Channels", DesignCon 2012, 16 pages.

International Search Report for PCT/US2014/053563, dated Nov. 11, 2014, 2 pages.

Clayton, P., "Introduction to Electromagnetic Compatibility", Wiley-Interscience, 2006.

She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.

Poulton, et al., "Multiwire Differential Signaling", UNC-CH Department of Computer Science Version 1.1, Aug. 6, 2003.

Skliar et al., A Method for the Analysis of Signals: the Square-Wave Method, Mar. 2008, Revista de Matematica: Teoria y Aplicationes, pp. 09-129.

International Search Report and Written Opinion from PCT/US2014/034220 mailed Aug. 21, 2014.

International Search Report and Written Opinion for PCT/US14/052986 mailed Nov. 24, 2014.

Burr, "Spherical Codes for M-ARY Code Shift Keying", University of York, Apr. 2, 1989, pp. 67-72, United Kingdom.

Slepian, D., "Premutation Modulation", IEEE, vol. 52, No. 3, Mar. 1965, pp. 228-236.

Stan, M., et al., "Bus-Invert Coding for Low-Power I/O, IEEE Transactions on Very Large Scale Integration (VLSI) Systems", vol. 3, No. 1, Mar. 1995, pp. 49-58.

Tallani, L., et al., "Transmission Time Analysis for the Parallel Asynchronous Communication Scheme", IEEE Tranactions on Computers, vol. 52, No. 5, May 2003, pp. 558-571.

International Search Report and Written Opinion for PCT/EP2012/052767 mailed May 11, 2012.

International Search Report and Written Opinion for PCT/EP2011/059279 mailed Sep. 22, 2011.

International Search Report and Written Opinion for PCT/EP2011/074219 mailed Jul. 4, 2012.

Notification of Transmittal of The International Search Report and The Written Opinion of the International Searching Authority, or The Declaration for PCT/EP2013/002681, dated Feb. 25, 2014, 15 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Abbasfar, A., "Generalized Differential Vector Signaling", IEEE International Conference on Communications, ICC '09, (Jun. 14, 2009), pp. 1-5.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Wang et al., "Applying CDMA Technique to Network-on-Chip", IEEE Transactions on Very Large Scale Integration (VLSI) Systems, vol. 15, No. 10 (Oct. 1, 2007), pp. 1091-1100.

Cheng, W., "Memory Bus Encoding for Low Power: A Tutorial", Quality Electronic Design, IEEE, International Symposium on Mar. 26-28, 2001, pp. 199-204, Piscataway, NJ.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Notification of Transmittal of International Search Report and The Written Opinion of the International Searching Authority, for PCT/US2015/018363, mailed Jun. 18, 2015, 13 pages.

Counts, L, et al., "One-Chip Slide Rule Works with Logs, Antilogs for Real-Time Processing," Analog Devices Computational Products 6, Reprinted from Electronic Design, May 2, 1985, 7 pages.

Design Brief 208 Using the Anadigm Multiplier CAM, Copyright 2002 Anadigm, 6 pages.

Grahame, J., "Vintage Analog Computer Kits," posted on Aug. 25, 2006 in Classic Computing, 2 pages, http.//www.retrothing.com/2006/08/classic_analog_.html.

Schneider, J., et al., "ELEC301 Project: Building an Analog Computer," Dec. 19, 1999, 8 pages, http://www.clear.rice.edu/elec301/Projects99/anlgcomp/.

Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.

"Introduction to: Analog Computers and the DSPACE System," Course Material ECE 5230 Spring 2008, Utah State University, www.coursehero.com, 12 pages.

Notification of Transmittal of The International Search Report and The Written Opinion of the International Searching Authority, or the Declaration, for PCT/US2014/015840, dated May 20, 2014. 11 pages.

Notification of Transmittal of The International Search Report and The Written Opinion of the International Searching Authority, or the Declaration, for PCT/US2014/043965, dated Oct. 22, 2014, 10 pages.

Notification of Transmittal of The International Search Report and The Written Opinion of the International Searching Authority, or The Declaration, dated Mar. 3, 2015, for PCT/US2014/066893, 9 pages.

International Preliminary Report on Patentability for PCT/US2014/015840, dated Aug. 11, 2015, 7 pages.

Jiang, A., et al., "Rank Modulation for Flash Memories", IEEE Transactions of Information Theory, Jun. 2006, vol. 55, No. 6, pp. 2659-2673.

Zouhair Ben-Neticha et al, "The streTched-Golay and other codes for high-SNR finite-delay quantization of the Gaussian source at ½ Bit per sample", IEEE Transactions on Communications, vol. 38, No. 12 Dec. 1, 1990, pp. 2089-2093, XP000203339, ISSN: 0090-6678, DOI: 10.1109/26.64647.

\* cited by examiner

SORTING DECODER

CROSS-REFERENCES TO RELATED APPLICATIONS

This application is a continuation of and claims priority under 35 USC §120 to U.S. application Ser. No. 13/844,331, filed Mar. 15, 2013, naming Harm Cronie and Brian Holden, entitled "Sorting Decoder" which is a non-provisional application claiming priority under 35 USC §119 to U.S. Provisional Patent Application No. 61/697,540, filed Sep. 6, 2012, entitled "SORTING DECODER", all of which are hereby incorporated herein by reference in their entirety for all purposes.

The following prior applications are herein incorporated by reference in their entirety for all purposes:

U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "SPM").

U.S. patent application Ser. No. 13/176,657, filed Jul. 5, 2011, naming Harm Cronie andAmin Shokrollahi, entitled "Methods and Systems for Low-power and Pin-efficient Communications with Superposition Signaling Codes" (hereinafter "SUPM").

U.S. patent application Ser. No. 13/464,849, filed May 4, 2012, naming Harm Cronie and Amin Shokrollahi, entitled "Differential vector storage for non-volatile memory" (hereinafter "NVM").

FIELD OF THE INVENTION

The present invention relates to decoder circuits generally, and more particularly to decoders used in chip-to-chip communication systems receivers and memory readers.

BACKGROUND

Communication Systems Background

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

The efficiency of digital communication systems can be expressed in terms of the time it takes to transfer certain amount of information (speed), the energy that is required to transmit the information reliably (power consumption) and, the number of wires per bit that is required for communication (pin-efficiency). In most systems, several trade-offs exist between these parameters and, depending on the application, some of these parameters may be more important than others. In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. [Slepian] suggested the use of permutation codes for transmission of information on communication channels in which signals are disturbed by Gaussian noise. More recently, practical vector signaling methods based on Permutation Modulation Codes, Sparse Modulation Codes or Superposition Signaling Codes, as taught by Cronie II, SPM and SUPM respectively, have been proposed to further optimize the trade-offs between power consumption, pin efficiency and noise robustness of chip-to-chip communication systems. In those vector signaling systems, the digital information is transformed into a different representation space in the form of a vector codeword, CW, that is chosen in order to optimize the power consumption, pin-efficiency and speed trade-offs based on the transmission channel properties and communication system design constraints. Herein, this process is referred to as "encoding". At the receiver side, the received signals corresponding to the codeword CW are transformed back into the original digital information representation space. Herein, this process is referred to as "decoding".

FIG. 1 represents a high-level block diagram of a prior art communication system. At the transmit unit 100 side of the communication system, an encoder 110 transforms a sequence of k information symbols 105 into a vector codeword CW. A driver 120 maps vector codeword CW into a set of physical signals and transmits them on the n wires 135 of bus 130. Although FIG. 1 shows a number of lines for the k information symbols 105 and a number of wires 135, it should be understood that different values for k and n could be used and they need not be equal.

At the other side of bus 130, a receive unit 140 maps the n received physical signals from wires 135 back into k information symbols 145. Receive unit 140 comprises a bus receiver in the form of a signal-to-digital converter ("SDC") 160 and a vector codeword decoder ("DEC") 170. In FIG. 1, a task of the SDC 160 is to reconstruct an estimate of the transmitted vector codeword CW from the analogue signals transmitted and recorded over the n bus wires 135. SDC 160 then transmits the estimate of vector codeword CW to codeword decoder 170. Codeword decoder 170 can then reconstruct the k output bits by applying the reverse transformation from that of transmit encoder 110. SDC 160 is shown comprising a sampler 180 and a rank-order unit 190.

As an example, bus 130 might be a bus between a processor and memory. In that case, the physical wires may take the form of striplines or microstrips on a PCB. Another example of bus 130 might be a set of wires connecting two different devices. The system of FIG. 1 may also be extended to bi-directional communication settings. In general, the information symbols may be bits, but other digital representations of information symbols as described above are also permissible.

Memory Systems Background

Common methods for storing digital information into volatile memory such as dynamic random-access memory ("DRAM"), as well as non-volatile memory such as flash memory ("Flash") or phase change memory ("PCM"), require physically storing the digital information in cells as a single or multilevel charge or material phase.

In general, when the charge or phase reaches its maximum level, it cannot be increased anymore so the cell needs to be erased back to the lower charge or phase value before it can store a new value, which has significant impact on the memory efficiency, reliability and lifetime with the current technologies. To address those issues, differential vector storage schemes have been recently proposed, as taught for instance by NVM, to further minimize the number of memory cell erasure cycles while enhancing the reliability and writing speed of memory systems.

Similarly, in the case of volatile DRAM, each bit of digital information is typically stored into a capacitor. Capacitors leak charge over time and therefore require periodic refresh to compensate for charge leakage, which has significant impact on the power consumption required to maintain the memory information suitable for reliable reading. To address those issues, differential vector storage schemes have been recently developed to further minimize the number of DRAM refresh operations as described and/or illustrated in, for example, NVM.

FIG. 2 represents a high-level block diagram of a generic memory system comprising a controller 200 a page read-write module 210, and a number of R/W modules 220 in charge with handling a set of individual memory cells or capacitors 230. In various memory systems, the page read-write module 210 further comprises, for each R/W module 220, a write encoder 240 and a read decoder 250. Read decoders 250 are shown including rank-order units 290.

Vector Processing Background

In this disclosure, we refer collectively to the methods disclosed in Cronie II, SPM, SUPM, NVM and similar extensions as "vector processing" methods.

In a system according to FIG. 1, in accordance with the vector signaling teachings of Cronie II, SPM and/or SUPM, at the transmitter side, in transmit unit 100, encoder 100 might comprise a vector signal encoder and driver 120 might comprise a bus driver. Transmit unit 100 processes the sequence of k information symbols 105 in a period T and thus takes in k new information symbols per period T. In preferred embodiments, T is substantially smaller than one second and transmit unit 100 can transmit the information content of k/T symbols per second. In the l-th time interval of T seconds, the vector signal encoder maps these k bits to a vector $CW_l$ of size n. During the l-th symbol period of T seconds, the bus driver generates the vector s(t) of n continuous signals, $s_1(t)$ to $s_n(t)$, for each of the n bus wires 1, . . . , n in bus 135 as:

$$s(t) = CW_l * p(t)$$

where p(t) is a pulse shape signal.

Various vector signal encoders may be applied, where the vector $CW_l$ may be a codeword from a permutation modulation code, a sparse signaling code, a superposition signaling code, or another code of a vector signaling method. For instance, the methods taught by Cronie II, SPM and/or SUPM respectively may be used, as well as other similar methods known to those skilled in the art, such as, for instance, the permutation modulation codes disclosed in [Slepian], or the signaling methods of [Cornelius] or [Poulton]. A permutation modulation code or sparse signaling code $CW_l$ is defined by a basis vector, $x_0$, where the code consists of all permutations of $x_0$. For the sake of illustration, we assume that the entries of $x_0$ are sorted in descending order, but other embodiments are also possible.

At the receiver side, a vector signal v(t) is received, which may be an attenuated version of the original vector signal s(t). Typically the channel response is frequency selective, which may lead to inter-symbol interference ("ISI"). Furthermore, noise may be added to the transmitted signal, for instance, Gaussian noise.

Without loss of generality, we assume that the receiver observes the received vector signal v(t) at some sampling time $t_0$ and we denote the resulting signal values by v. Sampler 180 can be a front-end sampler that samples the received vector signal y(t) at sampling time $t_0$ to generate the vector of samples v. In prior art systems with reference to FIG. 1, the sampled vector v is further input into rank-order unit 190.

The rank-order sorting operation may determine a full ordering of the sampled values on the wires or a partial order. A full ordering would mean that all values on the n wires are sorted. A partial ordering would mean that only a subset of the wires are determined that carry some of the largest and some of the smallest values, which is enough when the other values are non-quiescent, in particular in the case of a sparse modulation code.

As an illustration of a partial sorting application, in the 8b8w signaling plotted in FIG. 1 as taught by SPM where the basis vector $x_0$ is defined as:

$$x_0 = [1\ 1\ 0\ 0\ 0\ 0\ -1\ -1],$$

the output of rank-order unit 190 may only comprise four indices 195 on four wires/channels/etc. indicating the ranking of the wires where respectively the two largest (+1, +1) and the two smallest sample values (−1, −1) have been measured. Indeed, in the "8b8w" case, the four other wires' samples have a zero value and are quiescent.

Possible detailed embodiments of rank-order units 190 and codeword decoder 170 have been taught in SPM. For instance, in some embodiments, rank-order units 190 may further comprise a max-detector unit to select the largest (positive) values and a min-detector unit to select the smallest (negative) values out of the n components of the sampled y vector signal.

An example of a sampled vector signal may be:

$$y = [1.1\ 0.2\ -1.3\ 0.19\ -0.9\ 0.01\ -0.3\ 1.2]$$

where the largest value 1.2 is detected on wire 8, the second largest value 1.1 is detected on wire 1, the smallest value −1.3 is detected on wire 3 and the second smallest value is detected on wire 5. The remaining elements are treated as corresponding to zero values.

Codeword decoder 170 can then reconstruct the original vector $CW_l$ as:

$$CW_l = [1\ 0\ -1\ 0\ -1\ 0\ 0\ 1]$$

Codeword decoder 170 can then further reconstruct the k output bits 145 by mapping back vector $CW_l$ into the initial representation space, by applying the reverse operation of encoder 110.

REFERENCES

The following additional references to prior art have been cited in this application:

[Jiang] A. Jiang, R. Mateescu, M. Schwartz, and J. Bruck, "Rank Modulation for Flash Memories," published in the IEEE Transactions on Information Theory, Vol. 55, No. 6, pages 2659-2673, June 2009.

[Poulton] U.S. Pat. No. 6,556,628 B1 to John W. Poulton, Stephen G. Tell and Robert E. Palmer, and entitled "Methods and Systems for Transmitting and Receiving Differential Signals Over a Plurality of Conductors" issued Apr. 29, 2003.

[Cornelius] U.S. Pat. No. 6,661,355 B2 to William P. Cornelius and William C. Althas, entitled "Methods and Apparatus for Constant-Weight Encoding & Decoding" issued Dec. 9, 2003.

[Slepian] Slepian, D., "Permutation Modulation", published in Proc. of the IEEE, Vol. 53, No. 3, pp. 228-236, March 1965.

BRIEF SUMMARY OF THE INVENTION

A sorting decoder ("SD") determines the full or partial ranking of input signals as a binary representation using simple logic circuitry based on first state elements.

In a first embodiment, a sorting decoder SD compares a set of input signals with a dynamic reference signal that is monotonic over a sampling period T. The comparison results are further processed by a rank decoder ("RD") that comprises a set of single wire rank decoders ("SWRDs") to determine, for each single wire, the actual ranking of each input signal relative to the others. Each single wire rank decoder SWRD is made of self-timed first state elements for each input signal or the last member of a sorted collection of input signals.

In one possible embodiment, the SWRD first state elements are flip-flops that are clocked by one comparison output signal each on the one hand, and which capture a snapshot of the other comparison output signals on the other hand at the time when the clock comparison signal switches. That corresponds to the time when the input signal reaches the dynamic reference signal value. As the input signals typically have different values to be sorted, the flip-flops switch at different time and therefore take a different snapshot accordingly.

The flip-flop corresponding to the first rank input signal switches first and its output snapshot captures that no other signal has reached the reference value yet. The flip-flop corresponding to the second rank input signal switches second and its output snapshot captures that only one other input signal has reached the reference value before, and so on, until the flip-flop corresponding to the last rank input signal switches last. The latter output snapshot captures that all other input signals have already reached the reference value before the last one. Thus the output snapshot of each flip-flop represents the ranking of the corresponding wire.

In one embodiment, the rankings out of each single wire rank decoder SWRD are further processed by a sorting logic SL to output the relevant rank-order values or codewords to a codeword decoder 170, as needed by the system application. In one embodiment, the sorting logic simply comprises elementary NAND and NOR logic gates to detect the ranking of a wire.

In one embodiment, the dynamic reference signal is a current or voltage signal reference in electrical circuits. The dynamic reference signal is monotonous during the measurement period T, that is the sampling period in a communication system or the reading time interval in a memory system. In a simple embodiment, it is linearly decreasing or increasing during period T. In other embodiments, it can be adapted to maximize the measurement sensitivity according to the underlying signal representation characteristics such as the permutation code basis, the signal range and/or the noise properties specific to the system application.

The proposed sorting decoder thus provides an implementation that is substantially more efficient than some other rank-ordering solutions. In particular, conventional analogue-to-digital converter circuitry no longer needs to be integrated into the system design. Simple logic components and first state elements can be used instead. It is thus particularly well suited to the design of power efficient chip-to-chip communications as well as more reliable non-volatile memory systems, in particular, when used in association with vector signaling or vector storage applications to communication or memory systems respectively that are based on permutation codes. Moreover, as will be understood by one skilled in the art upon reading this disclosure, beyond its application to vector processing methods, the proposed sorting decoder circuit architecture is also generic enough to be applied to other digital signal processing applications where a set of analogue signals need to be sorted prior to being processed in the digital domain.

DETAILED DESCRIPTION OF THE INVENTION

Sorting Decoder

Figure 1:
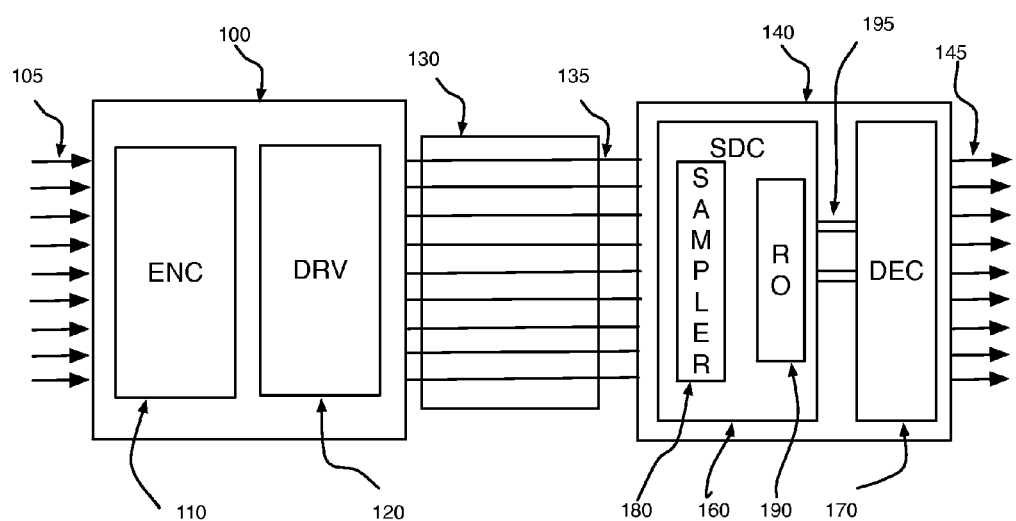
FIG. 1 represents a high-level block diagram of a communication system as known in the prior art.
Figure 2:
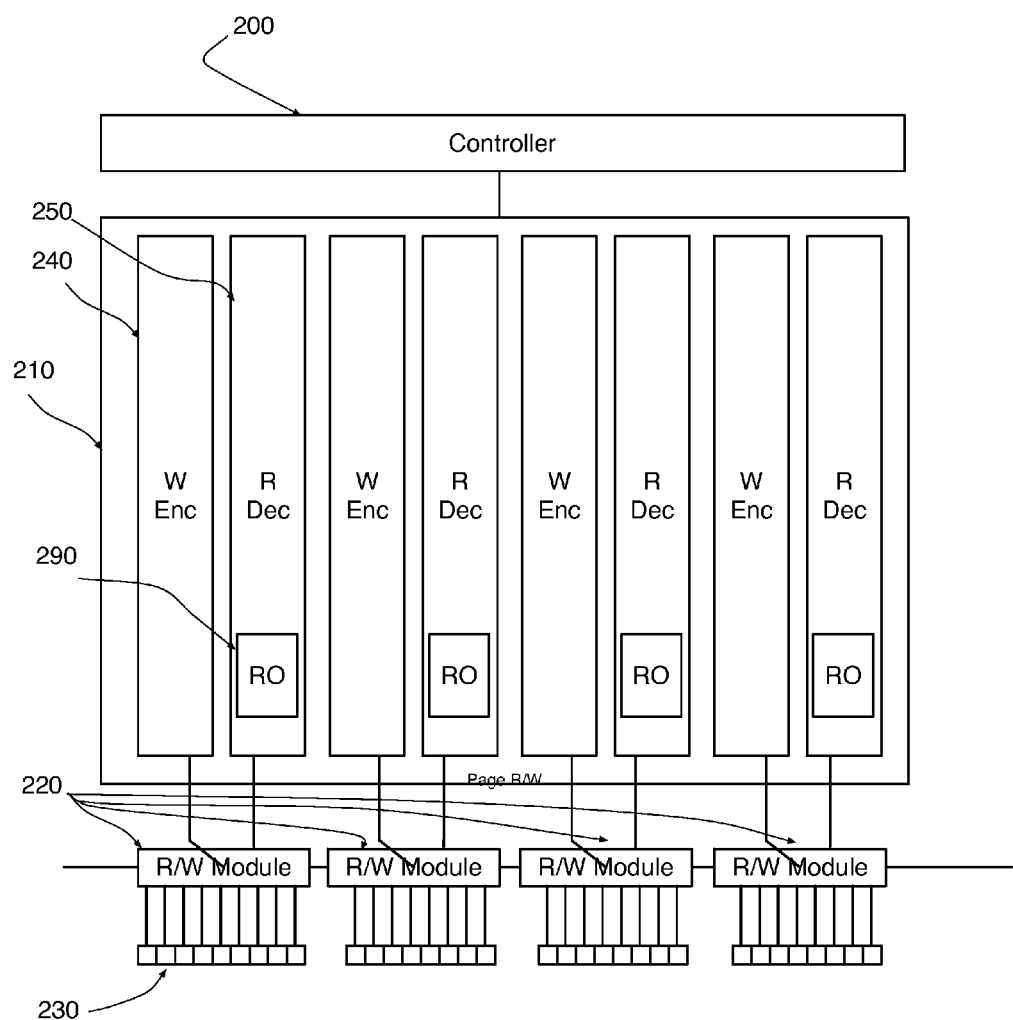
FIG. 2 shows a high-level block diagram of a memory system as known in the prior art.

While vector signaling and vector storage schemes as taught by Cronie II, SPM, SUPM, and/or NVM already provide substantial improvements over their respective prior art, there are some applications wherein additional improvements are possible, and sometimes may be necessary. For instance, in high-speed and/or low power communication and memory systems, it is desirable to avoid as much as possible analogue-to-digital converters and/or lookup memories in designing the integrated circuit for the communication system's receive unit 140 or read decoder 250 in favor of simpler gates and components, so that the integration scale factor and power efficiency, and consequently the overall cost, can be further optimized.

A common theme in vector processing methods is that the permutation modulation methods and/or coding methods, as employed by the communication or storage system respectively, are most efficiently decoded by integrating a sorting decoder at the communication receiver or at the memory reader decoder side respectively. Possible embodiments of SDC 160 have been taught in SPM where a rank-order unit 190, 290 sorts the input signals according to their ranking, as this ranking uniquely determines the underlying codeword of the permutation modulation code associated with the analogue signals transmitted over bus 130 or stored into memory cell capacitors.

In the more general case, a sorting decoder determines the rank-order of its input signals, that is, an indication of the relative ranks of each input signal compared to the others. Depending on the application, full or partial sorting may be applied. Partial sorting may amount to finding some largest values and some smallest values, such as, for instance, in accordance with the teachings by SPM where the transmitted vector codeword is a sparse codeword, meaning that it has few non-zero coordinates, and that it is completely specified by the locations of its non-zero coordinates. In the latter application, the sorting decoder may only have to output the ranking of these positions.

As will be recognized by one skilled in the art upon reading this disclosure, various embodiments of sampler 180 and rank-order 190 can be formed in semiconductor integrated circuits. A straightforward implementation would be to use an analog-to-digital converter ("ADC") for each input signal wire. The resolution of such an ADC may be chosen according to the vector signaling code use and/or additional processing that may be required. A sorting algorithm, a rank-order algorithm, or a look-up table memory can then be used in the digital domain for rank-ordering the resulting digitized samples. Such an implementation however presents substantial drawbacks in high speed communication systems such as modern chip-to-chip communications, in particular in terms of hardware integration size and power efficiency.

Prior art hardware optimization methods for chip-to-chip communication typically assume conventional signaling methods such as differential signaling rather than vector signaling. Similarly, prior art hardware optimization methods for non-volatile memory systems typically assume conventional single level or multilevel cell programming rather than vector storage. Therefore, what is needed is a sorting decoder semiconductor circuit architecture suitable to any sorting method that further optimizes the communication, respectively the memory storage system overall efficiency, beyond the substantial functional improvements brought by vector signaling, respectively vector storage methods.

Embodiments described herein can use prior art permutation sorting methods not covered by the vector processing methods of Cronie II, SPM, SUPM and/or NVM, such as, for example, the methods and apparatuses taught by [Cornelius] or [Poulton], as well as to the "rank modulation coding" by [Jiang].

More generally, embodiments of the present invention can apply to any communication or storage methods requiring sorting of the transmitted or stored physical signals to decode the corresponding digital information. In this disclosure, we refer collectively to the corresponding decoding methods as "sorting decoding" methods.

Such decoder architectures are disclosed in this application and some embodiments of the invention are directed towards solving these and other problems individually and collectively.

A first embodiment of a sorting decoder according to the teachings herein will now be further described with reference to FIG. 3.

Figure 3:
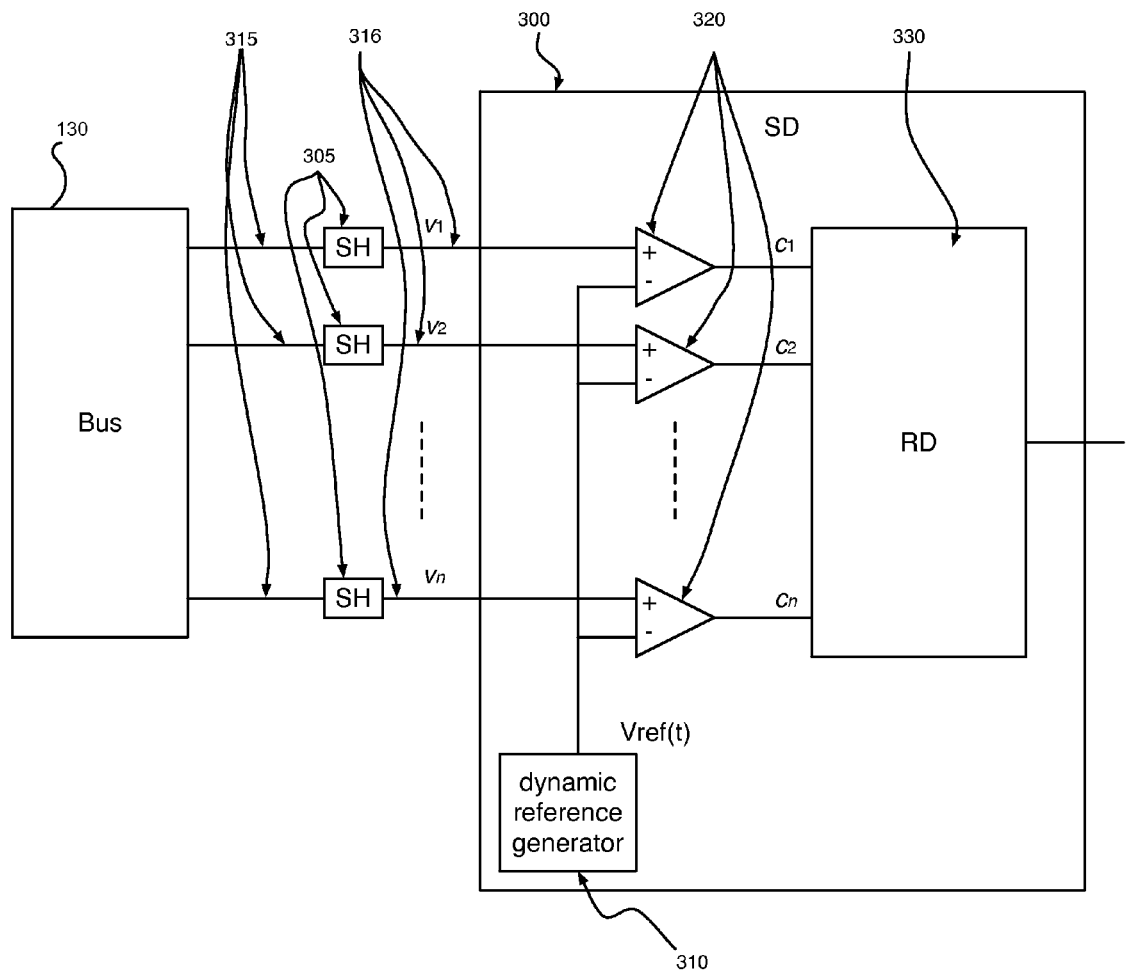
FIG. 3 represents a first embodiment of a sorting decoder ("SD") circuit architecture according to aspects of the present invention, wherein sample vector signal values are continuously compared with a dynamic reference value and the result of the comparison is fed into the rank decoder ("RD").

FIG. 3 represents a possible embodiment of a sorting decoder 300 according to aspects of the present invention using simple logic components. A sample and hold ("SH") unit 305 (j) samples the input signal 315 $v_j$ on each bus wire j. A plurality of comparators 320 continuously compares the sample-and-hold output signal 316 $v_j$ on each bus wire j with a monotonic signal generated by a dynamic reference generator 310. The output of comparator 320 is therefore a binary signal $c_j$, which is then input to rank decoder ("RD") logic 330.

The analogue signals 135 out of the n wires of bus 130 are denoted by $v_1(t), \ldots, v_n(t)$. In the exemplary embodiment illustrated in FIG. 3, each signal 315 $v_j(t)$ is sampled at time $t_0$ by a sample-and-hold ("SH") circuit 305, resulting in a sampled value 316 $v_j$, but other sampling embodiments are also possible. SH circuit 305 may also perform additional functions such as amplification and/or equalization. A dynamic reference generator 310 may generate a dynamic reference Vref(t) signal as a periodic waveform of period T, where T is the communication system symbol period duration. The reference signal may be measured as a voltage or a current. In a preferred embodiment, the dynamic reference Vref(t) signal is monotonically raising or falling during each symbol period duration T.

At each wire j, a comparator 320 continuously compares the resulting sample value 316 $v_j$ against dynamic reference Vref(t). This process of converting amplitude information to time on a single wire is known as voltage-to-time conversion. In a preferred embodiment, the conversion is applied simultaneously on each single wire so that each single wire rank decoder SWRD generates a joint voltage-to-time conversion while preserving the relative rank information of the input signals. Indeed, as the dynamic reference function Vref(t) is monotonic during the symbol duration T, the n comparators 320 switch only once in that time interval, when the dynamic reference signal Vref(t) reaches the sampled signal value 316 $v_j$ on wire j. Thus comparators 320 convert the amplitude information of the sampled signals 316 $v_1, \ldots, v_j, \ldots, v_n$ into a set of digital waveforms $c_1, \ldots, c_j, \ldots, c_n$ that switch value at a different time depending on the input amplitude value $v_1, \ldots, v_j, \ldots, v_n$. That information can then be used by the rank decoder RD unit 330 to extract the actual rank of the amplitude values of the sample signals 316 $v_1, \ldots, v_j, \ldots, v_n$.

As will be evident to one with moderate skill in the art, the shape of the reference signal waveform determines the precision and the conversion speed of the digital waveforms out of comparators 320. Depending on the practical embodiment, the dynamic reference signal Vref(t) may be a voltage or a current.

Figure 4A:
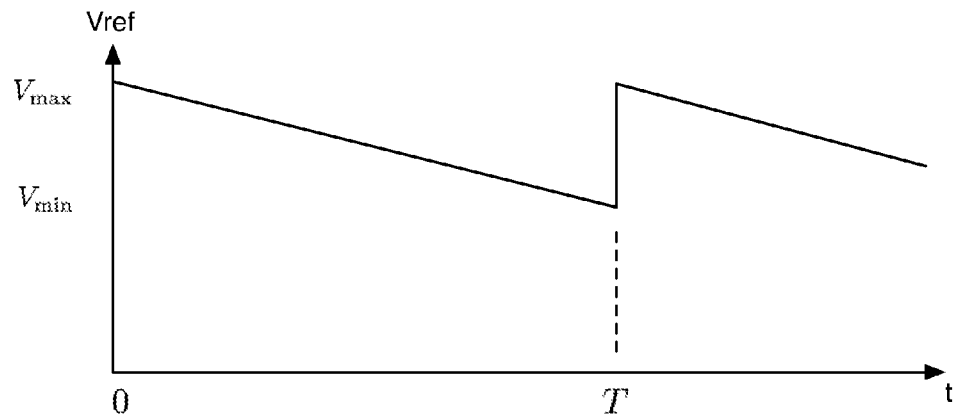
FIG. 4A shows a ramp waveform.
Figure 4B:
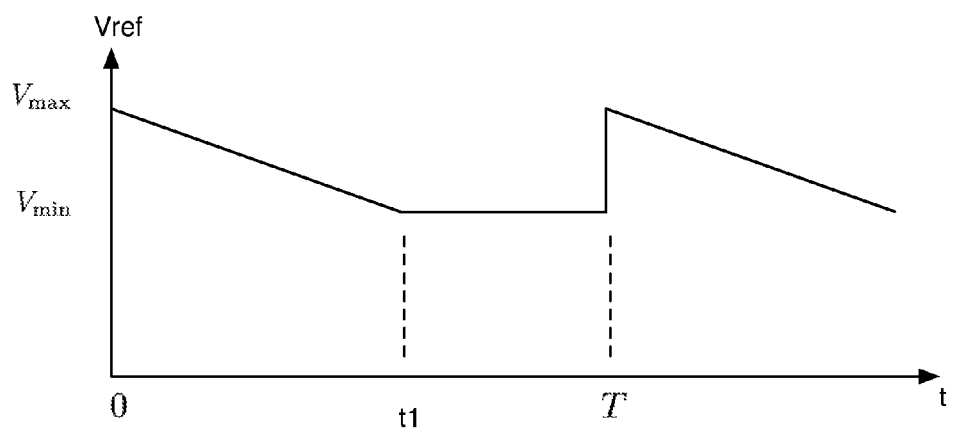
FIG. 4B shows a steeper ramp waveform.
Figure 4C:
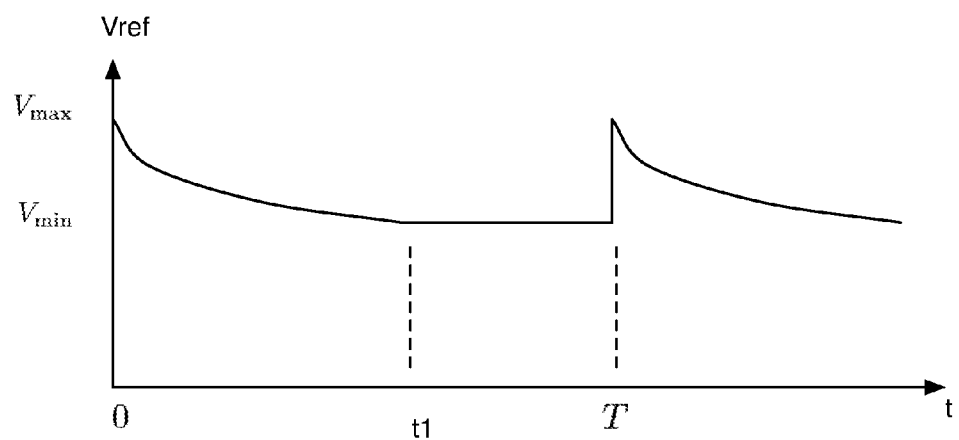
FIG. 4C shows a logarithmically falling ramp waveform.

FIGS. 4A-4C represent various possible embodiments of the dynamic reference signal waveform that can be tuned to match the input signals characteristics on the one hand, and the vector signaling code characteristics in the other hand. In a preferred embodiment where the overall sorting of the input signals is done in descending order of their respective amplitude, the dynamic reference signal Vref(t) is shaped as a ramp down from a Vmax value to a Vmin value over the T period, as shown, for instance, in FIG. 4A, so that the comparator 320 corresponding to the input wire with the highest amplitude signal switches first.

FIG. 4B shows another possible embodiment wherein the dynamic reference signal Vref(t) is shaped as a steeper ramp down from a Vmax value to a constant value Vmin after time $t_1$ during the T period. FIG. 4C shows a further alternate embodiment with a progressively slowing down reference value, using for instance a logarithmic falling function, from value Vmax down to a constant value Vmin after time $t_1$ during the T period.

While the embodiments shown in FIGS. 4A, 4B, 4C correspond to switching the input signals in descending order of their respective amplitude, the opposite embodiments where a dynamic reference signal Vref(t) is shaped as a monotonically increasing signal from a Vmin value to a Vmax value over the T period is possible too; in that case, the comparator 320 corresponding to the input wire with the highest amplitude signal will switch first and the comparators 320 will switch in ascending order of their respective wire input signal amplitude.

Figure 5:
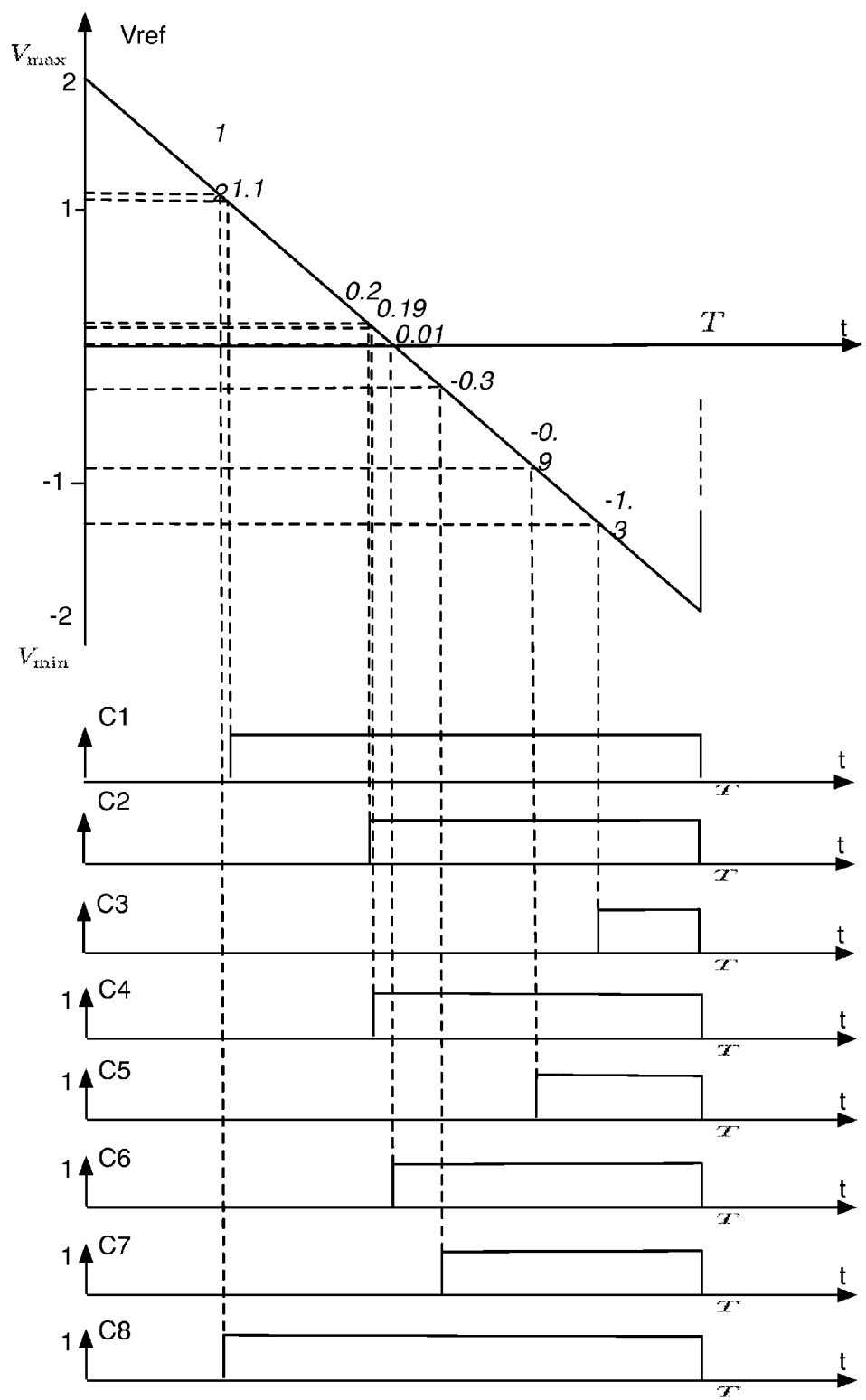
FIG. 5 shows an example of the digital waveforms output generated by the dynamic reference comparison in accordance with aspects of the present invention.

FIG. 5 shows an example of the digital waveforms $c_1, \ldots, c_j, \ldots, c_n$ shown as C1, C2, ..., C8 in FIG. 5 that are generated by the comparators 320 over a symbol period T when the linearly decreasing ramp of FIG. 4A is used as the dynamic reference signal basis over the former sampled signal example:

$$v = [1.1\ 0.2\ -1.3\ 0.19\ -0.9\ 0.01\ -0.3\ 1.2]$$

The eighth comparator is the first to switch as the dynamic reference Vref(t) reaches the input sample signal 315 value $v_8 = 1.2$ on wire 8, then the first comparator is the second to switch as the dynamic reference Vref(t) reaches the input sample signal 315 value $v_1 = 1.1$ on wire 1, and so on, until the third comparator finally switches as the dynamic reference Vref(t) reaches the smallest input sample signal 315 value $v_3 = -1.3$ on wire 3.

The values Vmax, Vmin, $t_1$ can be chosen in accordance to the type of permutation modulation code applied in the communication system on the one hand, and the transmission channel properties on the other hand. Thus, depending on the input signal range and the required measurement sensitivity, in particular in the presence of significant noise, a nonlinear monotonic waveform such as the plot in FIG. 4C may be better suited than the linear signal of FIG. 4A.

A preferred embodiment of circuit logic of rank decoder 330 used to extract the full or partial rank information will now be described in more detail with reference to FIG. 6 and FIG. 7.

Figure 6:
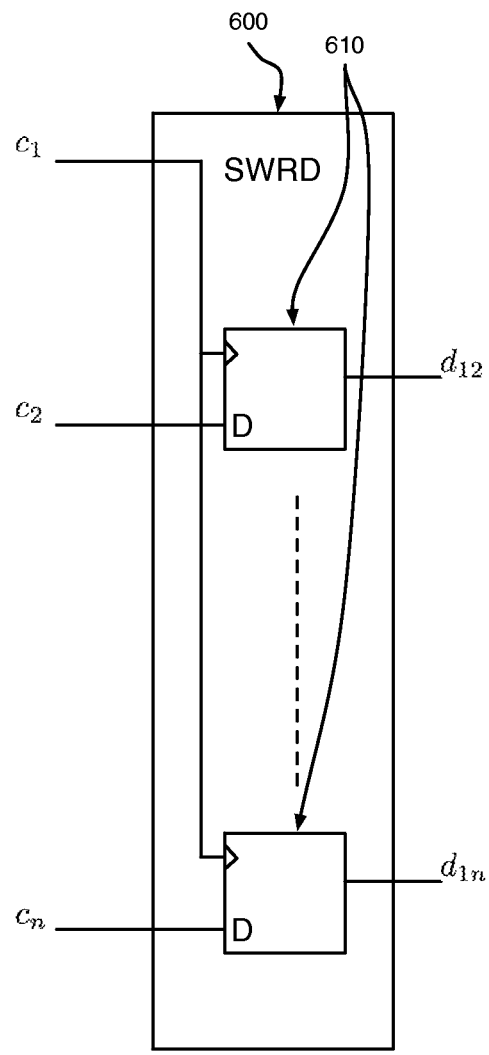
FIG. 6 represents a single wire rank decoding ("SWRD") unit.

FIG. 6 represents a possible embodiment of a circuit implementation of a single wire rank decoder SWRD unit 600 operating on the first wire waveform $c_1$ using n-1 flip-flops 610 fed by the $c_1$ waveform as the clock, where n is the number of bus wires 135. While FIG. 6 illustrates a preferred embodiment with a data flip-flops ("D flip-flop"), one skilled in the art will recognize that other first state elements or arbiter elements may be employed such as other types of flip-flops, latches, arbiters or a combination of these.

The single wire rank decoder SWRD unit 600 as illustrated by FIG. 6 over the first wire can be similarly designed for each separate wire. The i-th wire can generate a clock signal for the flip-flops of the other wires where the data input of these flip-flops is connected to the other wires. For instance, in the first single wire rank decoder SWRD unit 600 as illustrated by FIG. 6 over the first wire, the first flip-flop takes as data input the $c_2$ signal, so it outputs the snapshot value $d_{12}$ corresponding to the waveform value of $c_2$ during the rising and/or falling edge of $c_1$. The second flip-flop takes as data input the $c_3$ signal so it outputs the snapshot value $d_{13}$ corresponding to the value of waveform $c_3$ during the rising and/or falling edge of $c_1$. The n-1-th flip-flop takes as data input the $c_n$ signal, so it outputs the snapshot value corresponding to the value of waveform $c_n$ during the rising and/or falling edge of $c_1$. Consequently, the single wire rank decoder SWRD unit 600 outputs a snapshot vector $d_1$ representing the n-1 values of the digital waveforms $c_2, \ldots, c_j, \ldots c_n$ at the time when the digital waveform $c_1$ switches on.

More generally, it is possible to adapt onto each input wire j within n bus wires 135 a single wire rank decoder SWRD unit 600 that comprises n-1 flip-flops 610 fed by the $c_j$ waveform as the clock where n is the number of bus wires 135. In a preferred embodiment, each single wire rank decoder SWRD unit 600 operates independently from the others. Other embodiments are also possible.

It is noted that two or more input signals of nearly identical amplitude may lead to a timing race condition in the example embodiment of FIG. 6, as a flip-flop may receive a clock signal from one input source and a data input from another source that is changing nearly simultaneous with the clock signal, leaving the flip-flop in a metastable state. The design of the flip-flop, latch, arbiter, other element, or collection of other elements used in a practical embodiment might therefore incorporate conventional metastability hardening.

Figure 7:
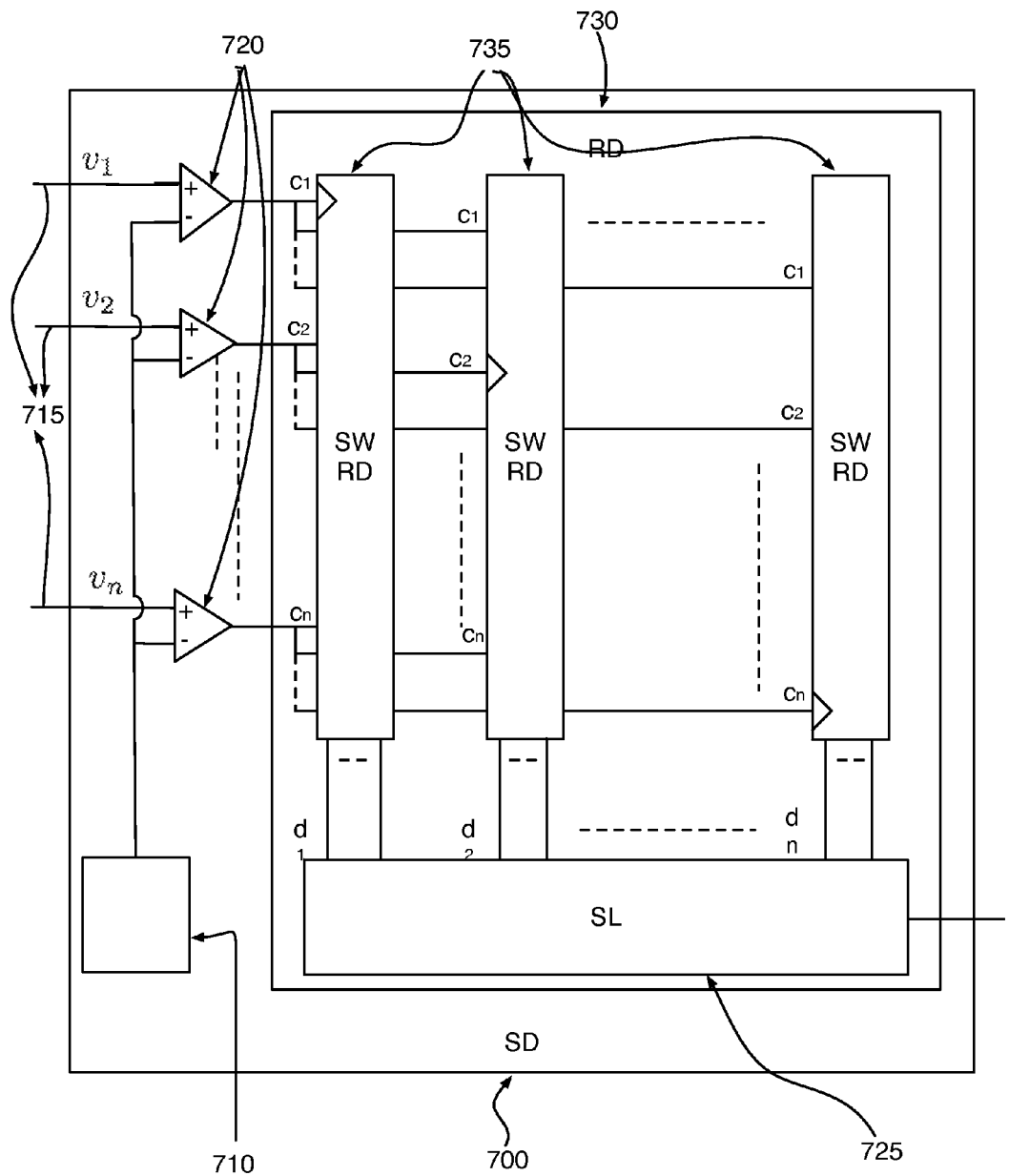
FIG. 7 represents a sorting decoder SD architecture according to a preferred embodiment.

FIG. 7 represents a possible embodiment of a proposed sorting decoder ("SD") 700. Sorting decoder 700 is shown comprising a predetermined number of comparators 720 operating on a set of input signal samples 715, a predetermined number of single wire rank decoders SWRD operating on the output of said comparators to decode the rank-order of each wire input signal sample using first state elements, a sorting logic ("SL") unit 725 to sort said rank-orders, and a dynamic reference generator 710, wherein comparators 720 compare the input signals values to a monotonic dynamic reference signal generated by dynamic reference generator 710 and each first state element outputs a snapshot of one input signal value rank relative to the other input signals.

The n single wire rank decoder SWRD units 735 operate in parallel over the n digital waveforms $c_1, c_2, \ldots, c_j, \ldots, c_n$ in accordance with the former embodiment of FIG. 6. Thus, the k-th single wire rank decoder SWRD unit comprises n-1 D flip-flops to process the n-1 digital waveforms $c_j$, where j is not equal to k. Each of n-1 flip-flops takes as the clock input the digital waveform signal $c_k$. Hence, the k-th rank-order decoding unit outputs a snapshot of the n-1 values of the digital waveforms $c_1, \ldots, c_j, \ldots, c_n$, for j≠k at the time when the digital waveform $c_k$ switches on.

As shown in FIG. 7, on each input wire j the corresponding single wire rank decoder SWRD unit 735 therefore extracts the rank vector $d_j$ which provides, when clock $c_j$ has switched at the latest at the end of the sampling period T, an estimate of the rank-order of the sample signal $v_j$ on wire j at the time of sampling period T.

In vector signaling applications, the n rank vectors $d_j$, j=1, 2, ... n, can then be processed by sorting logic 725 to output the relevant partial or full sorting information that uniquely determines the permutation codeword to codeword decoder 170. In alternate embodiments, sorting logic 725 may also output the codeword itself.

The operation of a rank decoder 730 may be better understood with reference to the numerical example of FIG. 5 as described by Table 1 for illustrative purposes. Table 1 shows the output of the 8 SWRD units 735 after all flip-flops have switched, at the latest by the end of sampling period T.

TABE 1

| Wire j | $d_{j1}$ | $d_{j2}$ | $d_{j3}$ | $d_{j4}$ | $d_{j5}$ | $d_{j6}$ | $d_{j7}$ | $d_{j8}$ | Rank |
|---|---|---|---|---|---|---|---|---|---|
| 1 | (clock) | 0 | 0 | 0 | 0 | 0 | 0 | 1 | 1 |
| 2 | 1 | (clock) | 0 | 0 | 0 | 0 | 0 | 1 | 2 |
| 3 | 1 | 1 | (clock) | 1 | 1 | 1 | 1 | 1 | 7 |
| 4 | 1 | 1 | 0 | (clock) | 0 | 0 | 0 | 1 | 3 |
| 5 | 1 | 1 | 0 | 1 | (clock) | 1 | 1 | 1 | 6 |
| 6 | 1 | 1 | 0 | 1 | 0 | (clock) | 0 | 1 | 4 |
| 7 | 1 | 1 | 0 | 1 | 0 | 1 | (clock) | 1 | 5 |
| 8 | 0 | 0 | 0 | 0 | 0 | 0 | 0 | (clock) | 0 |

As can be seen in the above numerical example, the number of "1's" in the $d_j$ vector correspond to wire j's signal digital ranking: in the example of FIG. 5, 1 for wire 1, 2 for wire 2, 7 for wire 3, 3 for wire 4, 6 for wire 5, 4 for wire 6, 5 for wire 7 and 0 for wire 8.

While the example above is described with binary values 0, 1, for the sake of numerical illustration, the output of the single wire rank decoder SWRD circuit 735 can be a physical signal that may be measured as a current or voltage against a common reference or differentially.

Figure 8:
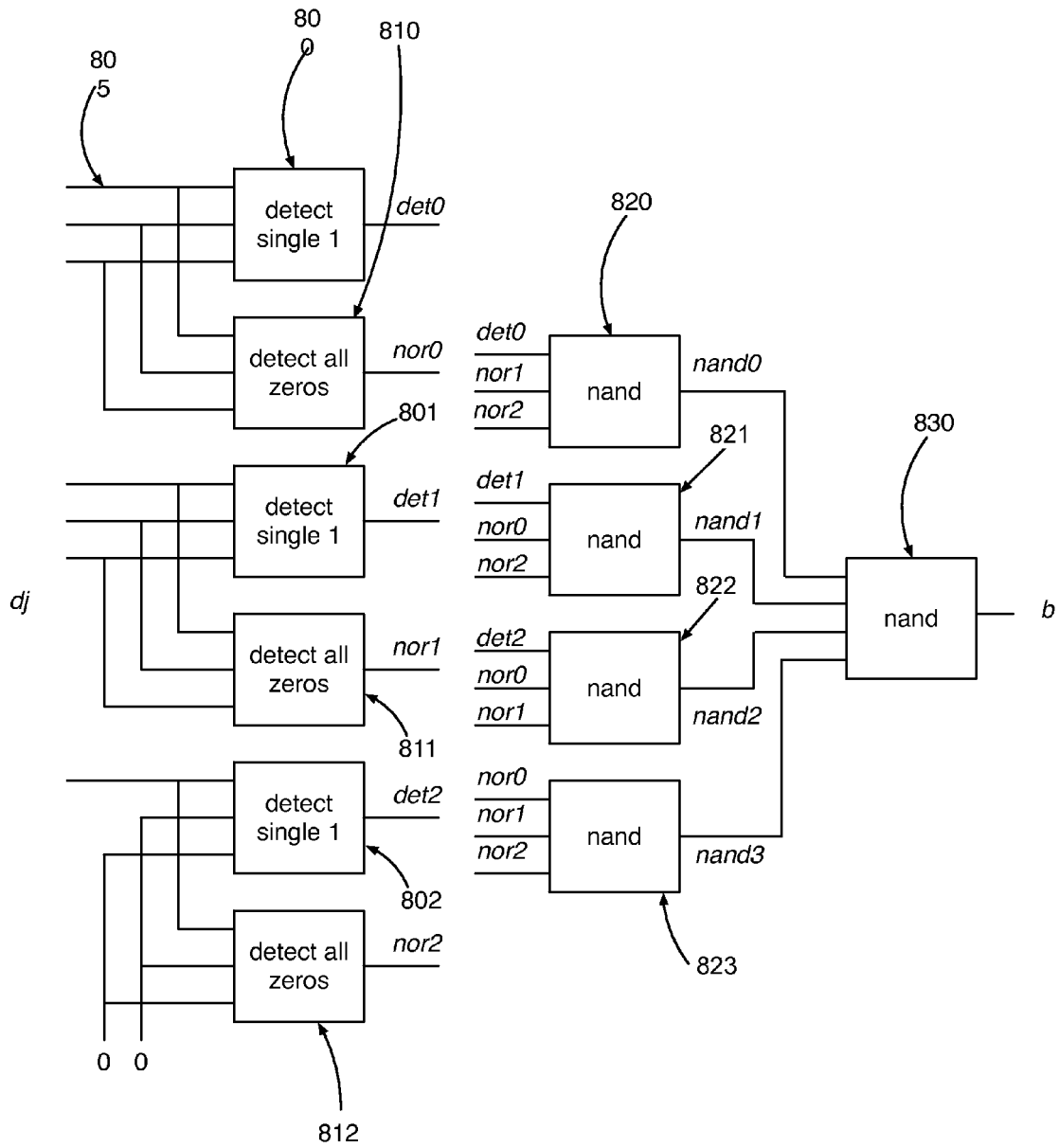
FIG. 8 shows a possible embodiment of the proposed sorting logic SL circuit architecture.

A possible embodiment of the sorting logic 725 using elementary NAND and NOR logic gates suitable for the 8b8w signaling plotted in FIG. 1 as taught by SPM will now be described with reference to FIG. 8, FIG. 9 and FIG. 10. In the 8b8w signaling where the sparse vector $x_0 = [1\ 1\ 0\ 0\ 0\ 0\ -1\ -1]$ is used as the permutation codeword basis, the codeword is uniquely defined by the rank-order of the two smallest and the two largest sample values, that is ranks 0, 1, 6 and 7. FIG. 8 shows a logic gate implementation for generating an output detection bit b for each bus wire j indicating whether this wire carries the first and second largest sample signal values (rank-order 0 and 1 respectively).

The "detect single 1" logic unit 800 takes as input the first 3 bits of the j-th SWRD output vector $d_j$ 805 and outputs bit det0=1 if and only if one single input bit is 1, 0 otherwise. The "detect single 1" logic unit 801 takes as input the next 3 bits of vector $d_j$ and outputs bit det1=1 if and only if one single input bit is 1, 0 otherwise. The "detect single 1" logic unit 802 takes as input the last bit of vector $d_j$ and two fixed zero bits, and outputs det2=1 if and only if one single input bit is 1, 0 otherwise.

The "detect all zeros" logic unit 810 takes as input the first 3 bits of the $j^{th}$ SWRD output vector $d_j$ and outputs nor0=1 if all input bits are 0s, 0 otherwise. The "detect all zeros" logic unit 811 takes as input the next 3 bits of vector $d_j$ and outputs bit nor1=1 if all input bits are 0s, 0 otherwise. The "detect single 1" logic unit 812 takes as input the last bit of vector $d_j$ and two fixed zero bits, and outputs nor2=1 if the last bit is 0, 0 otherwise.

The bits det0, nor1, nor2 are further processed by a three-input NAND gate 820 to output nand0 as 0 if all of them are 1s, 1 otherwise.

The bits det1, nor0, nor2 are further processed by a three-input NAND gate 821 to output nand1 as 0 if all of them are 1s, 1 otherwise.

The bits det2, nor0, nor1 are further processed by a three-input NAND gate 822 to output nand2 as 0 if all of them are 1s, 1 otherwise.

The bits nor0, nor1, nor2 are further processed by a three-input NAND gate 823 to output nand3 as 0 if all of them are 1s, 1 otherwise.

The resulting bits nand0, nand1, nand2 and nand3 are finally processed by a four-input NAND gate 830 to output the final detection bit as 0 if all of them are 1s, 1 otherwise.

Table 2 represents the resulting mapping for each of the eight bus wires' SWRD units in the former numerical example of FIG. 5 and Table 1. The resulting detection bit b is 0 on all wires except wire 8 and wire 1, which carry the two largest values, as the corresponding sample signal values $v_8=1.2$ on bus wire 8 and $v_1=1.1$ on bus wire 1 are the first and second largest detected values by the sorting logic in the former numerical example of FIG. 5.

TABLE 2

| j | $d_j$ | det0 | nor0 | det1 | nor1 | det2 | nor2 | nand0 | nand1 | nand2 | nand3 | b |
|---|---|---|---|---|---|---|---|---|---|---|---|---|
| 1 | 0000001 | 0 | 1 | 0 | 1 | 1 | 0 | 1 | 1 | 0 | 1 | 1 |
| 2 | 1000001 | 1 | 0 | 0 | 1 | 1 | 0 | 1 | 1 | 1 | 1 | 0 |
| 3 | 1111111 | 0 | 0 | 0 | 0 | 1 | 0 | 1 | 1 | 1 | 1 | 0 |
| 4 | 1100001 | 0 | 0 | 0 | 1 | 1 | 0 | 1 | 1 | 1 | 1 | 0 |
| 5 | 1101111 | 0 | 0 | 0 | 0 | 1 | 0 | 1 | 1 | 1 | 1 | 0 |
| 6 | 1101001 | 0 | 0 | 1 | 0 | 1 | 0 | 1 | 1 | 1 | 1 | 0 |
| 7 | 1101011 | 0 | 0 | 0 | 0 | 1 | 0 | 1 | 1 | 1 | 1 | 0 |
| 8 | 0000000 | 0 | 1 | 0 | 1 | 0 | 1 | 1 | 1 | 1 | 0 | 1 |

The same sorting logic can be used to detect the first and second smallest values corresponding to rank-orders 6 (wire 5) and 7 (wire 3) by simply inverting the bits of the $j^{th}$ SWRD output vector $d_j$ on each wire j before inputting them into the sorting logic of FIG. 8.

Figure 9:
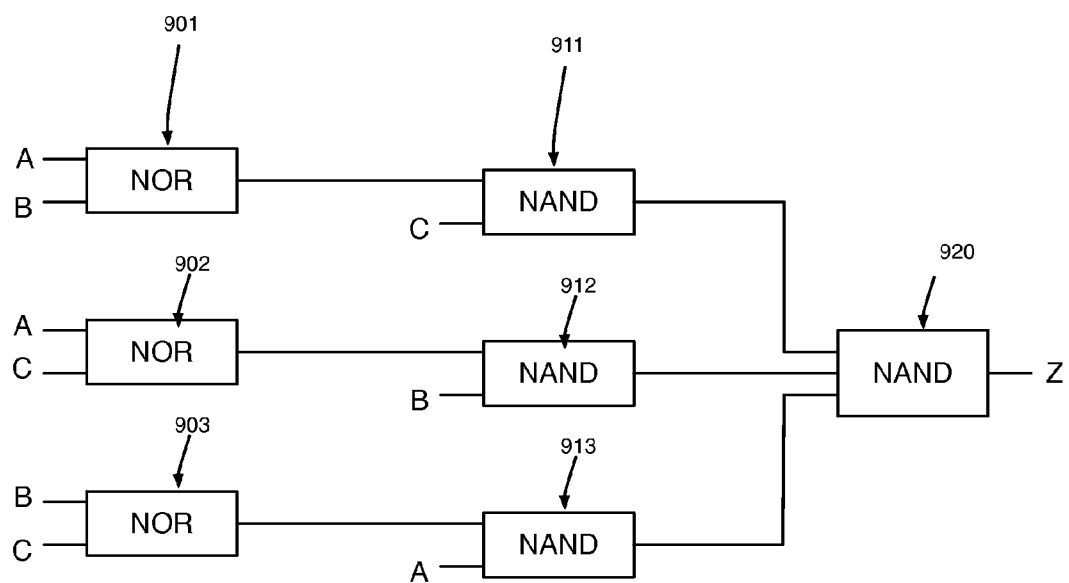
FIG. 9 shows a possible embodiment of the proposed "detect single 1" logic using elementary NOR and NAND logic components.

FIG. 9 shows a possible embodiment of the "detect single 1" logic unit 800, 801, 802 for three input bits A, B, C. A NOR gate 901 outputs 1 if both A and B are 0, 0 otherwise. The output of the NOR gate 901 is connected to a NAND gate 911 which outputs 0 if A and B are 0 and C is 1, 0 otherwise. A NOR gate 902 outputs 1 if both A and C are 0, 0 otherwise. The output of the NOR gate 902 is connected to a NAND gate 912 which outputs 0 if A and C are 0 and B is 1, 0 otherwise. A NOR gate 903 outputs 1 if both B and C are 0, 0 otherwise. The output of the NOR gate 902 is connected to a NAND gate 912 which outputs 0 if B and C are 0 and B is 1, 0 otherwise. NAND gates 911, 912 and 913 are further connected to a three-input NAND gate 920 which outputs 1 if and only if A and B are 0 and C is 1, or A and C are 0 and B is 1, or B and C are 0 and A is one, that is if and only if a single bit out of the three input bits A, B, C is detected as a 1.

Figure 10:
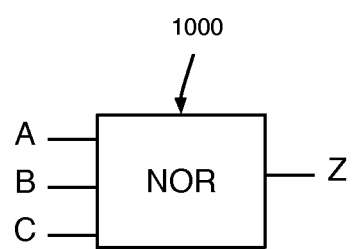
FIG. 10 shows a possible embodiment of the proposed "detect all 0s" logic using of elementary NOR logic components.

FIG. 10 shows a possible embodiment of the "detect all 0" logic unit as a three-input NOR gate 1000, which outputs 1 if and only if all three input bits A, B and C are 0.

The above described sorting logic architecture example is meant only to illustrate, but in no way to limit, the claimed invention. It shows a simple example of a possible embodiment with a limited number of simple logic gates suitable for partial sorting of the quiescent input signals in the specific case of the 8b8w signaling based on a sparse permutation modulation as taught by SPM, but it will be evident to one skilled in the art that other embodiments are also possible. In particular, in the general case, it is also possible to design a sorting logic suitable for full sorting on the input signals. As will be recognized by one skilled in the art one major advantage of the proposed sorting decoder architecture is the use of simple logic components that can be efficiently integrated into a semiconductor integrated circuit design. The sorting decoder is also inherently self-timed and does not require conventional analogue to digital conversion.

As will be evident to one skilled in the art, other embodiments of the invention are also possible.

For instance in a preferred embodiment the comparison performed by comparators 320 as shown in the embodiment of FIG. 3 is implemented with single input limiting amplifiers. Such an embodiment is now further described with reference with FIG. 11.

Figure 11:
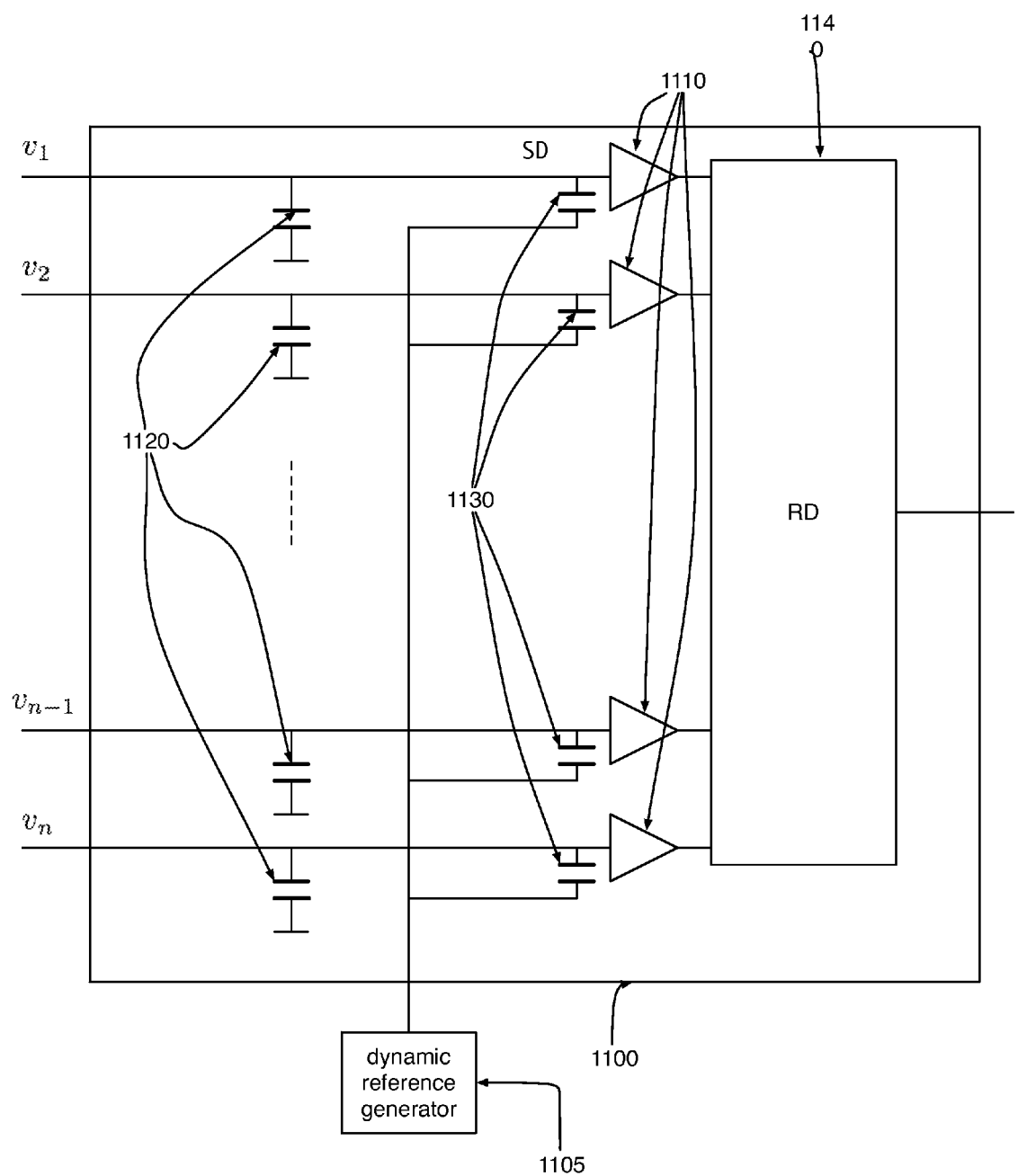
FIG. 11 represents an alternate embodiment of the dynamic reference comparison implementation in the proposed sorting decoder SD architecture.

FIG. 11 shows a sorting decoder 1100 that comprises n limiting amplifiers 1110. The input samples are stored on capacitors 1120. A dynamic reference generator 1105 couples the dynamic reference to the sample capacitive nodes through coupling capacitors 1130. In this way, the dynamic reference generator lifts each of the voltages on capacitors 1120 either upwards or downwards depending on the signal generated by the dynamic reference generator 1105. Each of the limiting amplifiers 1110 has a fixed threshold. It is assumed that the values stored on capacitors 1120 are initially below or above this threshold. The dynamic reference generator will move them close to the threshold until the corresponding limiting amplifier switches. The output of the limiting amplifiers 1110 is input to an RD unit 1140 that extracts the rank-order.

In a preferred embodiment, the N largest or N smallest values among the wire samples are detected and the logic used is tailored to this purpose. An improved method for the selection of the N largest or N smallest values is now described. The method is referred to as the N-member latching ("NML") method. Using this method, the identities of the N most extreme members of a given polarity among a plurality of signal wires are latched in a single moment. The N most extreme members of the other polarity are latched in another single moment. One element that enables this circuit uses a glitchless counter to determine the moment to latch the signals.

Glitchless counters are a class of well-known circuits used to derive an arithmetic property from a plurality of signal wires. This class of counters is defined by the absence XOR gates. Ordinary combinatorial counter circuits have many XOR gates and produce an encoded output. An example of an ordinary counter is a four bit binary encoded combinatorial counter that produces the value 0x0010 when two of its inputs are high. In the moment when the output of the ordinary combinatorial counter is switching between its values, glitches may occur on a decoded version of the encoded output.

Glitchless counters instead use a collection of AND and OR gates to derive a specific arithmetic property. A glitchless counter that detects whether one or more of a collection of wires is asserted is simply the OR of all of the input wires. A glitchless counter that detects whether two or more of a collection of wires are asserted can be constructed by connecting an AND gate to each combination of two of the inputs. The output of the AND gates are then connected to the inputs of a large OR gate or collection of OR gates. Similarly, an example glitchless counter that detects whether three or more of a plurality of wires is asserted has three input AND gates connected to each combination of the input wires. The outputs of the AND gates are connected to the input of a large OR gate or collection of OR gates.

Any arithmetic function can be constructed in such a way, although the circuit is typically larger than an ordinary counter. Logic synthesis tools can reduce the number of gates required, but the total is larger. One purpose of using such a circuit is to prevent the output from receiving momentary deassertions as the inputs come and go as long as the defined minimum number of the plurality of inputs is asserted.

In a sorting decoder that uses an RD unit as exemplified in FIGS. 7-10, the reference voltage is swept across the input range of the device, and as the voltage crosses the voltage of the input, the output of each differential output signals that the voltage has been crossed. Additional logic then latches the value up to the N maximum inputs that are to be detected. The circuit also detects the N minimum inputs by a similar approach.

In the NML method, a glitchless counter that has been designed to detect N members is employed to latch the N extreme members. Several variants of the circuit exist.

Five basic variants of the circuit are described below relating to how the voltage is swept:

Positive to negative sweep—A glitchless counter "A" is prepared that detects N asserted inputs and another "B" that detects all but N+1 asserted inputs. As the voltage is swept from positive to negative, a rising edge on signal A is used to latch or register the N most extreme positive signals. A rising edge on signal B is used to latch or register the N most extreme negative signals.

Negative to positive sweep—A glitchless counter "A" is prepared that detects N deasserted inputs and another "B" is prepared that detects all but N+1 deasserted inputs. As the voltage is swept from negative to positive, a rising edge on signal A is used to latch or register the N most extreme negative signals. A rising edge on signal B is used to latch or register the N most extreme positive signals.

Middle to extreme sweep—A glitchless counter "A" is prepared that detects N+1 asserted inputs and another "B" is prepared that detects all but N+1 asserted inputs. The voltage is swept from the midpoint to the one of the extremes and then from the middle to the other extreme. As the voltage is swept from the middle to the positive, a falling edge on signal A is used to latch or register the N most extreme positive signals. As the reference voltage is swept from the middle to the negative extreme, a falling edge on signal B is used to latch or register the N most extreme negative signals. An enhanced embodiment sweeps somewhat past the middle to allow for more common-mode noise on the input.

Extremes to middle—A glitchless counter "A" is prepared that detects N asserted inputs and another "B" that detects all but N asserted inputs. The voltage is swept from the one of the extremes to the midpoint and then from the other extreme to the midpoint. As the voltage is swept from the positive to the middle, a rising edge on signal A is used to latch or register the N most extreme positive signals. As the reference voltage is swept from the negative extreme to the midpoint, a rising edge on signal B is used to latch or register the N most extreme negative signals. An enhanced embodiment starts each sweep from a level somewhat on the other side of the middle from where the sweep will end allow for more common-mode noise on the input.

In yet other variations, a circuit as per any of the other four variants is used, but where the positive and negative elements are determined by circuits including separate differential amplifiers.

Figure 12:
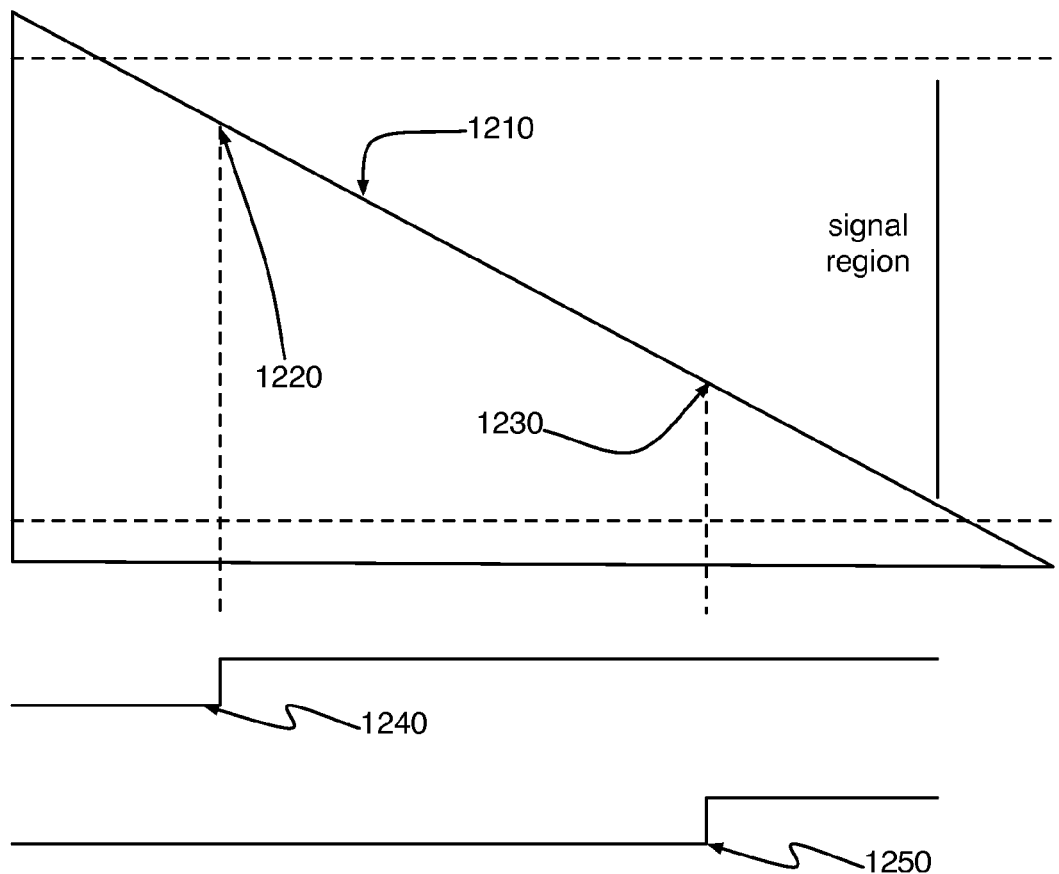
FIG. 12 shows an embodiment of the proposed sorting decoder SD circuit architecture in a memory system.

FIG. 12 exemplifies the dynamic behavior of the RD unit that is based on the NML method. The dynamic reference signal is illustrated by 1210 and a first glitchless counter detects when the dynamic reference has become smaller than the N largest values present at the input of the sorting decoder. At that moment 1220, the output waveform 1240 of the glitchless counter switches to a high state. At the moment 1230, when the M smallest values are detected the output of a second glitchless counter 1250 switches from a low to a high state. The output waveforms 1240 and 1250 are used to latch the values of the comparators and from this data the position of the N largest and M smallest values is easily detected by digital logic.

Figure 13:
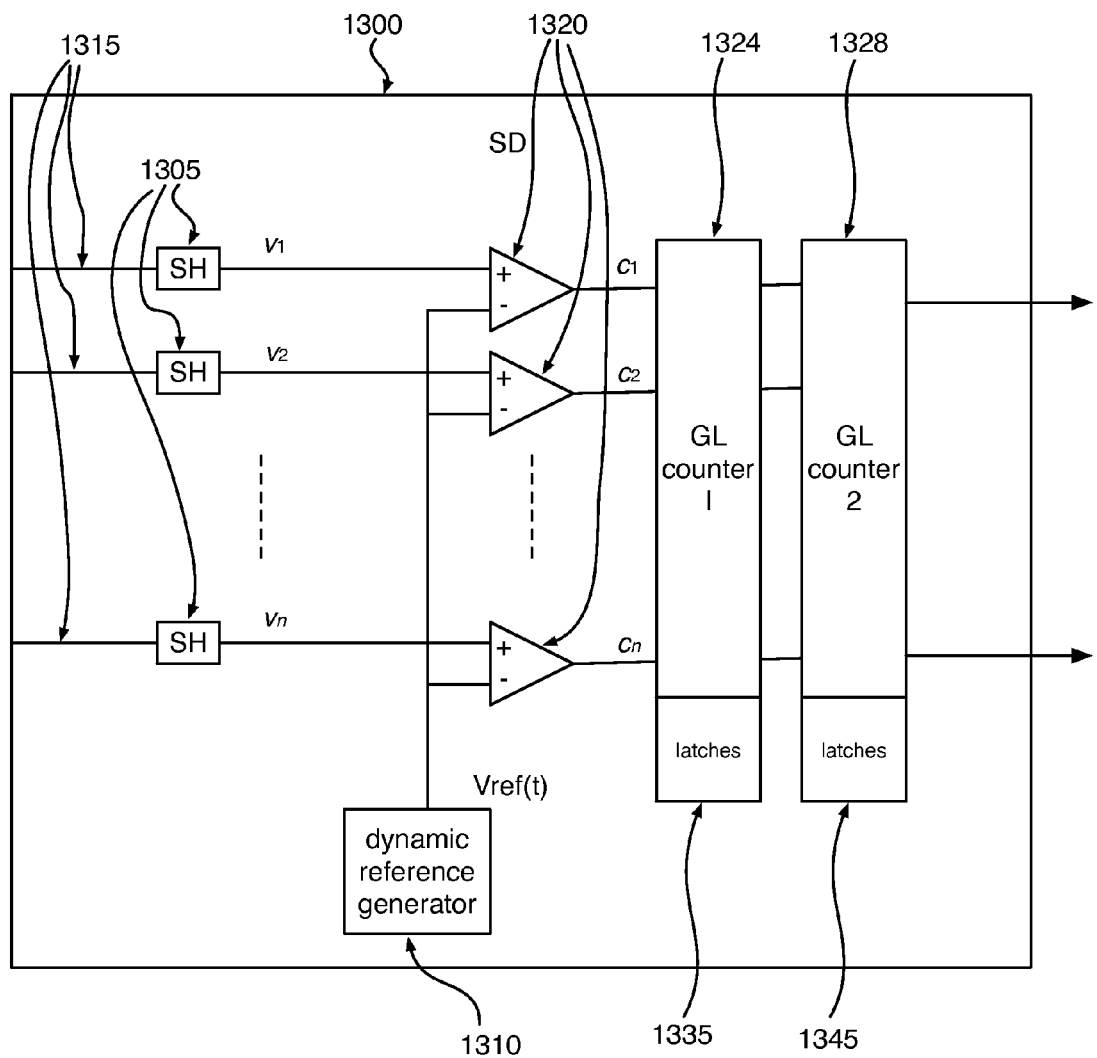
FIG. 13 shows an embodiment of a sorting decoder that uses an NML method.

FIG. 13 exemplifies an embodiment of a sorting decoder 1300 that uses the NML method to perform its operation. The output of comparators 1320 is input to two glitchless counters 1324, 1328. Latches 1335 and 1345 are configured to latch the output of the comparators 1320 at the moment that the N largest and M smallest values of $v_1, \ldots, v_n$ are detected. Also shown are inputs 1315, a dynamic reference generator 1310 and sample and hold units 1305.

While the above embodiments have been first detailed in the example of a communication system based on vector signaling, it should be apparent to one skilled in the art upon reading this disclosure that other signaling methods will also benefit from the proposed sorting decoder architecture. Furthermore, the above embodiments are also applicable to the field of memory systems.

Figure 14:
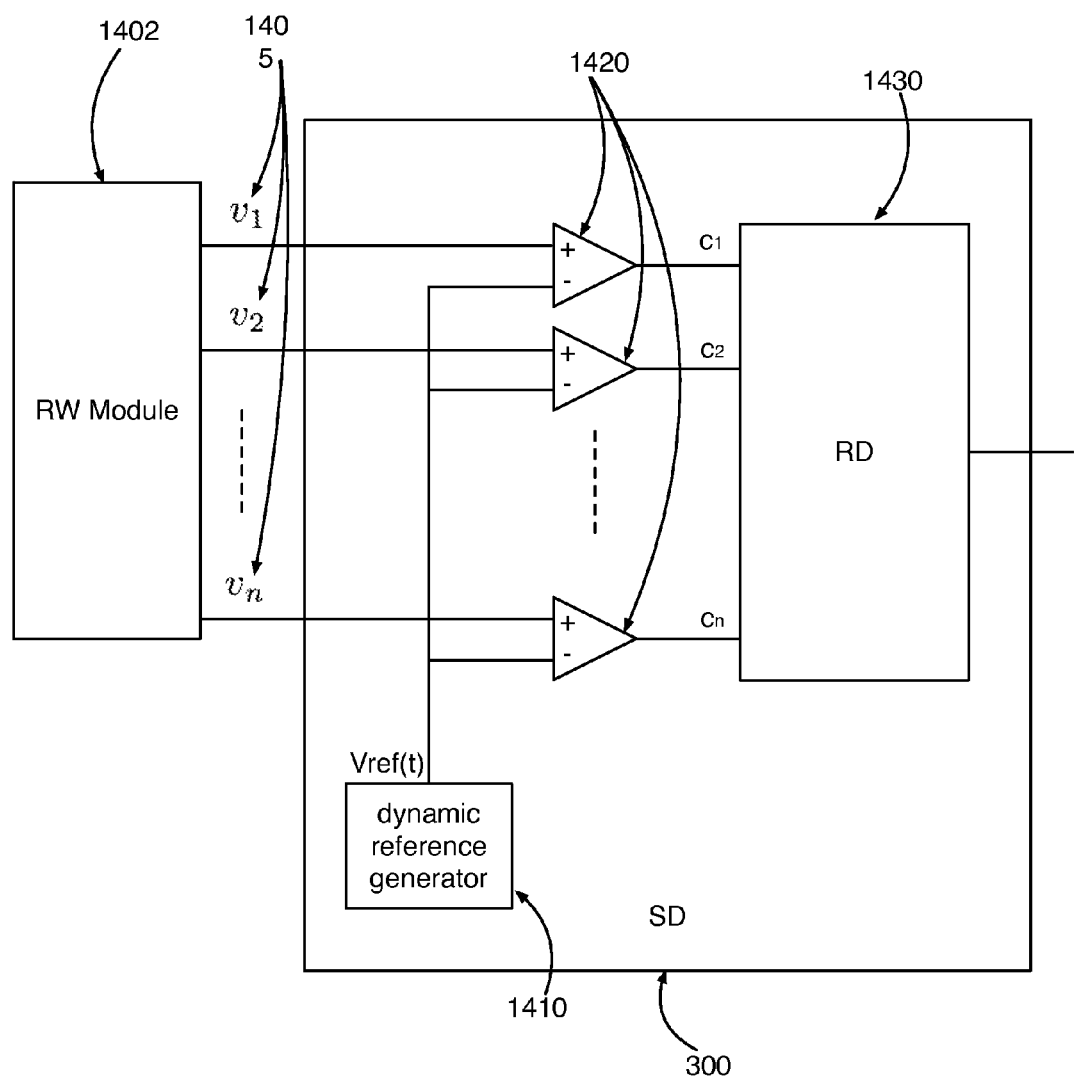
FIG. 14 shows a proposed vector storage memory reading process.

For instance, in the case of vector storage, as disclosed in NVM, when the memory needs to be read, each cell charge is an input analogue signal to measure and sort in order to reconstruct the associated vector coding and derive the corresponding digital information. A possible application of the proposed invention to vector storage memory reading will now be further described with reference to FIG. 14. A memory block read-write module 1402 outputs n signals 1405 ($v_j$, j=1, . . . , n) corresponding to the stored physical value on each memory cell j. Comparators 1420 continuously compare the signals $v_j$ corresponding to memory cells j with a monotonic signal generated by a dynamic reference generator 1410. The outputs of comparators 1420 are therefore binary signals $c_j$, which are then input to rank decoder RD logic 1430. Rank decoder logic 1430 may be implemented in accordance with the formerly described embodiments based on a series of single wire rank decoders SWRD 600 based on first state elements and a sorting logic 700 based on elementary logic gates similar to the case of vector signaling applications, as illustrated by the former FIG. 6 and FIG. 7.

In this disclosure, most of the examples refer to communication buses and memory systems where the wires carry electrical signals. However one of ordinary skill in the art, upon reading this disclosure, should recognize that the methods disclosed below are not limited to electrical signals only. The methods may readily be applied in other settings, such as that of optical communications. In the case of optical channels, fiber or other media might replace wires.

While the present invention has been primarily disclosed in the framework of vector processing methods, it will be evident to one skilled in the art that it also applies to prior art permutation sorting methods not covered by the vector processing methods of Cronie II, SPM, SUPM and/or NVM, such as for example the methods and apparatuses taught by [Cornelius] or [Poulton], as well as to the "rank modulation coding" of [Jiang]. More generally, the present invention may apply to any communication or storage methods requiring sorting of transmitted or stored physical signals to decode the corresponding digital information.

What is claimed is:

1. A sorting decoder comprising:
    a dynamic reference generator configured to generate a monotonic dynamic reference signal;
    a set of n comparators, each comparator configured to operate on (i) a respective input signal of a set of n input signals and (ii) the monotonic dynamic reference signal, the set of n comparators configured to form a set of n comparator outputs;
    a first logic circuit configured to detect when N comparator outputs of the set of n comparator outputs have a low state and n-N remaining comparator outputs have a high state and output a first latching signal, the N comparator outputs corresponding to a set of N most positive input signals, wherein 1≤N<n;
    a first latch configured to latch a first snapshot of n comparator outputs from the set of n comparators based on the first latching signal;
    a second logic circuit configured to detect when M comparator outputs of the set of n comparator outputs have a high state and n-M remaining comparator outputs have a low state and output a second latching signal, the M comparator outputs corresponding to a set of M most negative input signals, wherein 1≤M<n; and,
    a second latch configured to latch a second snapshot of n comparator outputs from the set of n comparators based on the second latching signal.

2. The sorting circuit of claim 1, further comprising a decoder configured to generate a codeword based on the first and second snapshots of n comparator outputs.

3. The sorting circuit of claim 1, wherein the first and second logic circuits comprise glitchless counters to detect the N most positive input signals and the M most negative n input signals.

4. The sorting circuit of claim 3, wherein a delay of the glitchless counters is balanced by a delay element.

5. The sorting circuit of claim 1, wherein the monotonic dynamic reference signal corresponds to a voltage sweep in a positive-to-negative direction.

6. The sorting circuit of claim 1, wherein the monotonic dynamic reference signal corresponds to a voltage sweep is in a negative-to-positive direction.

7. The sorting circuit of claim 1, wherein the monotonic dynamic reference signal corresponds to voltage sweeps in midpoint-to-extreme directions.

8. The sorting circuit of claim 1, wherein the monotonic dynamic reference signal corresponds to voltage sweeps in extreme-to-midpoint directions.

9. The sorting circuit of claim 1, wherein a high state corresponds to a logic '1' and a low state corresponds to a logic '0'.

10. The sorting circuit of claim 3, wherein the glitchless counters comprise AND and OR gates.

11. A method comprising:
    generating, using a dynamic reference generator, a monotonic dynamic reference signal;
    forming a set of n comparator outputs by operating on (i) a respective input signal of a set of n input signals and (ii) the monotonic dynamic reference signal;

detecting when a set of N comparator outputs have a low state and n-N comparators have a low state, and responsively generating a first latching signal, the N comparator outputs corresponding to a set of N most positive input signals, wherein $1 \leq N < n$;

latching a first snapshot of n comparator outputs based on the first latching signal;

detecting when a set of M comparator outputs have a high state and n-M comparator outputs have a low state, and responsively generating a second latching signal, the M comparator outputs corresponding to a set of M most negative input signals, wherein $1 \leq M < n$; and, latching a second snapshot of n comparator outputs based on the second latching signal.

12. The method of claim 11, further comprising forming a codeword by decoding the first and second snapshots of n comparator outputs.

13. The method of claim 11, wherein the N most positive input signals and the M most negative n input signals are detected using glitchless counters.

14. The method of claim 13, wherein a delay of the glitchless counters is balanced by a delay element.

15. The method of claim 11, wherein the monotonic dynamic reference signal corresponds to a voltage sweep in a positive-to-negative direction.

16. The method of claim 11, wherein the monotonic dynamic reference signal corresponds to a voltage sweep is in a negative-to-positive direction.

17. The method of claim 11, wherein the monotonic dynamic reference signal corresponds to voltage sweeps in midpoint-to-extreme directions.

18. The method of claim 11, wherein the monotonic dynamic reference signal corresponds to voltage sweeps in extreme-to-midpoint directions.

19. The method of claim 11, wherein a high state corresponds to a logic '1' and wherein a low state corresponds to a logic '0'.

20. The method of claim 13, wherein the glitchless counters comprise AND and OR gates.

* * * * *